United States Patent
Swenson et al.

(10) Patent No.: US 12,102,017 B2
(45) Date of Patent: Sep. 24, 2024

(54) KINETIC INDUCTANCE FOR COUPLERS AND COMPACT QUBITS

(71) Applicant: D-WAVE SYSTEMS INC., Burnaby (CA)

(72) Inventors: Loren J. Swenson, San Jose, CA (US); George E. G. Sterling, Vancouver (CA); Mark H. Volkmann, Burnaby (CA); Colin C. Enderud, Vancouver (CA)

(73) Assignee: D-WAVE SYSTEMS INC., Burnaby (CA)

( * ) Notice: Subject to any disclaimer, the term of this patent is extended or adjusted under 35 U.S.C. 154(b) by 406 days.

(21) Appl. No.: 17/429,456

(22) PCT Filed: Feb. 13, 2020

(86) PCT No.: PCT/US2020/018137
§ 371 (c)(1),
(2) Date: Aug. 9, 2021

(87) PCT Pub. No.: WO2020/168097
PCT Pub. Date: Aug. 20, 2020

(65) Prior Publication Data
US 2022/0123048 A1     Apr. 21, 2022

Related U.S. Application Data

(60) Provisional application No. 62/806,240, filed on Feb. 15, 2019, provisional application No. 62/863,431, filed on Jun. 19, 2019.

(51) Int. Cl.
*H10N 69/00*     (2023.01)
*G06N 10/40*     (2022.01)
(Continued)

(52) U.S. Cl.
CPC ............. *H10N 69/00* (2023.02); *G06N 10/40* (2022.01); *H10N 60/12* (2023.02); *H10N 60/805* (2023.02)

(58) Field of Classification Search
CPC ...... H10N 60/12; H10N 60/805; H10N 69/00; H10N 60/0156; H10N 60/126;
(Continued)

(56) References Cited

U.S. PATENT DOCUMENTS

| | | | |
|---|---|---|---|
| 4,009,479 A | 2/1977 | Cardinne et al. | |
| 4,028,714 A | 6/1977 | Henkels | |

(Continued)

FOREIGN PATENT DOCUMENTS

| | | |
|---|---|---|
| CN | 1471180 A | 1/2004 |
| CN | 101088102 A | 12/2007 |

(Continued)

OTHER PUBLICATIONS

Campbell, et al., "Electron Spin Resonance Scanning Probe Spectroscopy for Ultrasensitive Biochemical Studies", Analytical Chemistry Publications, Anal. Chem. 2015, 87, 4910-4915, 7 pages.
(Continued)

*Primary Examiner* — Fernando L Toledo
*Assistant Examiner* — Marshall Mu-Nuo Hatfield
(74) *Attorney, Agent, or Firm* — Cozen O'Connor

(57) ABSTRACT

A circuit can include a galvanic coupling of a coupler to a qubit by a segment of kinetic inductance material. The circuit can include a galvanic kinetic inductance coupler having multiple windings. The circuit can include a partially-galvanic coupler having multiple windings. The partially-galvanic coupler can include a magnetic coupling and a galvanic coupling. The circuit can include an asymmetric partially-galvanic coupler having a galvanic coupling and a first magnetic coupling to one qubit and a second magnetic (Continued)

coupling to a second qubit. The circuit can include a compact kinetic inductance qubit having a qubit body loop comprising a kinetic inductance material. A multilayer integrated circuit including a kinetic inductance layer can form a galvanic kinetic inductance coupling. A multilayer integrated circuit including a kinetic inductance layer can form at least a portion of a compact kinetic inductance qubit body loop.

15 Claims, 10 Drawing Sheets

(51) Int. Cl.
*H10N 60/12* (2023.01)
*H10N 60/80* (2023.01)

(58) Field of Classification Search
CPC .... H10N 60/0912; H10N 60/00; G06N 10/40; G06N 10/00; Y10S 977/933; B82Y 10/00
See application file for complete search history.

(56) References Cited

U.S. PATENT DOCUMENTS

| | | | |
|---|---|---|---|
| 4,454,522 A | 6/1984 | De | |
| 4,490,733 A | 12/1984 | Kroger | |
| 4,554,567 A | 11/1985 | Jillie et al. | |
| 4,689,559 A | 8/1987 | Hastings et al. | |
| 4,749,888 A | 6/1988 | Sakai et al. | |
| 4,912,975 A | 4/1990 | Ohta et al. | |
| 5,055,158 A | 10/1991 | Gallagher et al. | |
| 5,084,438 A | 1/1992 | Matsubara et al. | |
| 5,087,605 A | 2/1992 | Hegde et al. | |
| 5,131,976 A | 7/1992 | Hoko | |
| 5,157,466 A | 10/1992 | Char et al. | |
| 5,250,817 A | 10/1993 | Fink | |
| 5,274,249 A | 12/1993 | Xi et al. | |
| 5,290,761 A | 3/1994 | Keating et al. | |
| 5,307,068 A | 4/1994 | Hartemann | |
| 5,323,344 A | 6/1994 | Katayama et al. | |
| 5,323,520 A | 6/1994 | Peters et al. | |
| 5,339,457 A | 8/1994 | Kawasaki et al. | |
| 5,358,928 A | 10/1994 | Ginley et al. | |
| 5,514,974 A | 5/1996 | Bouldin | |
| 5,548,130 A | 8/1996 | Shimizu et al. | |
| 5,627,139 A | 5/1997 | Chin et al. | |
| 5,672,212 A | 9/1997 | Manos | |
| 5,767,043 A | 6/1998 | Cantor et al. | |
| 5,776,863 A | 7/1998 | Silver | |
| 5,804,251 A | 9/1998 | Yu et al. | |
| 5,846,846 A | 12/1998 | Suh et al. | |
| 5,858,106 A | 1/1999 | Ohmi et al. | |
| 5,863,868 A | 1/1999 | Chan et al. | |
| 5,869,846 A | 2/1999 | Higashino et al. | |
| 5,880,069 A | 3/1999 | Nakao et al. | |
| 5,892,243 A | 4/1999 | Chan | |
| 5,962,865 A | 10/1999 | Kerber et al. | |
| 5,962,866 A | 10/1999 | Diiorio et al. | |
| 6,011,981 A | 1/2000 | Alvarez et al. | |
| 6,165,801 A | 12/2000 | Burns et al. | |
| 6,188,919 B1 | 2/2001 | Lagraff et al. | |
| 6,242,387 B1 | 6/2001 | Cukauskas et al. | |
| 6,284,721 B1 | 9/2001 | Lee | |
| 6,362,638 B1 | 3/2002 | Ashton et al. | |
| 6,384,423 B1 | 5/2002 | Kerber et al. | |
| 6,384,424 B1 | 5/2002 | Kugai et al. | |
| 6,420,189 B1 | 7/2002 | Lopatin | |
| 6,459,097 B1 | 10/2002 | Zagoskin | |
| 6,476,413 B1 | 11/2002 | Jia et al. | |
| 6,495,854 B1 | 12/2002 | Newns et al. | |
| 6,517,944 B1 | 2/2003 | Puzey et al. | |
| 6,541,789 B1 | 4/2003 | Sato et al. | |
| 6,563,311 B2 | 5/2003 | Zagoskin | |
| 6,569,252 B1 | 5/2003 | Sachdev et al. | |
| 6,624,122 B1 | 9/2003 | Holesinger et al. | |
| 6,627,915 B1 | 9/2003 | Ustinov et al. | |
| 6,715,944 B2 | 4/2004 | Oya et al. | |
| 6,753,546 B2 | 6/2004 | Tzalenchuk et al. | |
| 6,767,840 B1 | 7/2004 | Uehara et al. | |
| 6,803,599 B2 | 10/2004 | Amin et al. | |
| 6,882,293 B2 | 4/2005 | Shoji et al. | |
| 6,905,887 B2 | 6/2005 | Amin et al. | |
| 6,936,808 B2 | 8/2005 | Uchida | |
| 6,979,836 B2 | 12/2005 | Zagoskin et al. | |
| 7,091,132 B2 | 8/2006 | Tan et al. | |
| 7,135,701 B2 | 11/2006 | Amin et al. | |
| 7,418,283 B2 | 8/2008 | Amin | |
| 7,533,068 B2 | 5/2009 | Maassen et al. | |
| 7,619,437 B2 | 11/2009 | Thom et al. | |
| 7,624,088 B2 | 11/2009 | Johnson et al. | |
| 7,638,434 B2 | 12/2009 | Helneder | |
| 7,639,035 B2 | 12/2009 | Berkley | |
| 7,843,209 B2 | 11/2010 | Berkley | |
| 7,876,248 B2 | 1/2011 | Berkley et al. | |
| 7,898,282 B2 | 3/2011 | Harris et al. | |
| 8,008,942 B2 | 8/2011 | Van et al. | |
| 8,018,244 B2 | 9/2011 | Berkley | |
| 8,035,540 B2 | 10/2011 | Berkley et al. | |
| 8,098,179 B2 | 1/2012 | Bunyk et al. | |
| 8,169,231 B2 | 5/2012 | Berkley | |
| 8,190,548 B2 | 5/2012 | Choi | |
| 8,195,596 B2 | 6/2012 | Rose et al. | |
| 8,283,943 B2 | 10/2012 | Van Den Brink et al. | |
| 8,301,214 B1 | 10/2012 | Tolpygo et al. | |
| 8,421,053 B2 | 4/2013 | Bunyk et al. | |
| 8,437,818 B1 | 5/2013 | Tolpygo et al. | |
| 8,536,566 B2 | 9/2013 | Johansson et al. | |
| 8,571,614 B1* | 10/2013 | Mukhanov | H10N 60/10 29/829 |
| 8,611,974 B2 | 12/2013 | Maibaum et al. | |
| 8,644,898 B1 | 2/2014 | De Andrade et al. | |
| 8,742,594 B2 | 6/2014 | Daubenspeck et al. | |
| 8,854,074 B2 | 10/2014 | Berkley | |
| 8,933,695 B1 | 1/2015 | Kornev et al. | |
| 8,951,808 B2 | 2/2015 | Ladizinsky et al. | |
| 9,130,116 B1 | 9/2015 | Tolpygo et al. | |
| 9,136,457 B2 | 9/2015 | Tolpygo | |
| 9,183,508 B2 | 11/2015 | King | |
| 9,324,767 B1* | 4/2016 | Steinbach | H10N 69/00 |
| 9,355,362 B2 | 5/2016 | Shea et al. | |
| 9,490,296 B2 | 11/2016 | Ladizinsky et al. | |
| 9,495,644 B2 | 11/2016 | Chudak et al. | |
| 9,520,180 B1 | 12/2016 | Mukhanov et al. | |
| 9,564,573 B1 | 2/2017 | Chang et al. | |
| 9,634,224 B2 | 4/2017 | Ladizinsky et al. | |
| 9,768,371 B2 | 9/2017 | Ladizinsky et al. | |
| 9,971,970 B1 | 5/2018 | Rigetti et al. | |
| 9,978,809 B2 | 5/2018 | Ladizinsky et al. | |
| 10,141,493 B2 | 11/2018 | Tuckerman | |
| 10,454,015 B2 | 10/2019 | Lanting et al. | |
| 10,528,886 B2 | 1/2020 | Boothby | |
| 10,938,346 B2 | 3/2021 | Berkley et al. | |
| 11,038,095 B2 | 6/2021 | Huang et al. | |
| 11,100,416 B2* | 8/2021 | Lanting | G06N 10/00 |
| 11,105,866 B2 | 8/2021 | Swenson et al. | |
| 11,127,893 B2 | 9/2021 | Johnson et al. | |
| 11,295,225 B2 | 4/2022 | Hoskinson et al. | |
| 2001/0020701 A1 | 9/2001 | Zagoskin | |
| 2002/0017906 A1 | 2/2002 | Ho et al. | |
| 2002/0117738 A1 | 8/2002 | Amin et al. | |
| 2002/0180006 A1 | 12/2002 | Franz et al. | |
| 2002/0188578 A1 | 12/2002 | Amin et al. | |
| 2002/0190343 A1 | 12/2002 | Jones et al. | |
| 2002/0190381 A1 | 12/2002 | Herr et al. | |
| 2003/0027724 A1 | 2/2003 | Rose et al. | |
| 2003/0068832 A1 | 4/2003 | Koval et al. | |
| 2003/0089987 A1 | 5/2003 | Parikh | |
| 2003/0102470 A1 | 6/2003 | Il et al. | |
| 2003/0107033 A1 | 6/2003 | Tzalenchuk et al. | |
| 2004/0077504 A1 | 4/2004 | Adachi et al. | |
| 2004/0087081 A1 | 5/2004 | Aitchison et al. | |
| 2004/0155237 A1 | 8/2004 | Kerber | |

(56) References Cited

U.S. PATENT DOCUMENTS

| | | | |
|---|---|---|---|
| 2004/0191697 A1 | 9/2004 | Nakatsuka et al. | |
| 2004/0266209 A1 | 12/2004 | Hinode et al. | |
| 2005/0029512 A1 | 2/2005 | Hato et al. | |
| 2005/0062131 A1 | 3/2005 | Murduck et al. | |
| 2005/0107261 A1 | 5/2005 | Cantor et al. | |
| 2006/0197193 A1 | 9/2006 | Gu et al. | |
| 2008/0001699 A1 | 1/2008 | Gardner et al. | |
| 2008/0070325 A1 | 3/2008 | Tolpygo | |
| 2009/0033353 A1 | 2/2009 | Yu et al. | |
| 2009/0078931 A1 | 3/2009 | Berkley | |
| 2009/0203192 A1 | 8/2009 | Kaltalioglu et al. | |
| 2009/0319757 A1* | 12/2009 | Berkley | G06N 10/00 257/31 |
| 2011/0022820 A1 | 1/2011 | Bunyk et al. | |
| 2011/0065586 A1 | 3/2011 | Maibaum et al. | |
| 2011/0089405 A1 | 4/2011 | Ladizinsky et al. | |
| 2012/0319211 A1 | 12/2012 | Van Dal et al. | |
| 2013/0116159 A1 | 5/2013 | Pollard et al. | |
| 2014/0111242 A1 | 4/2014 | Xie et al. | |
| 2015/0032994 A1 | 1/2015 | Chudak et al. | |
| 2015/0046681 A1 | 2/2015 | King | |
| 2015/0119252 A1 | 4/2015 | Ladizinsky et al. | |
| 2015/0119253 A1 | 4/2015 | Yohannes et al. | |
| 2015/0219730 A1 | 8/2015 | Tsukamoto et al. | |
| 2015/0236235 A1 | 8/2015 | Ladizinsky et al. | |
| 2016/0079968 A1 | 3/2016 | Strand et al. | |
| 2016/0170675 A1 | 6/2016 | Pickerell et al. | |
| 2018/0053689 A1 | 2/2018 | Kirby et al. | |
| 2018/0145631 A1 | 5/2018 | Berkley et al. | |
| 2018/0219150 A1 | 8/2018 | Lanting et al. | |
| 2018/0308896 A1 | 10/2018 | Ladizinsky et al. | |
| 2018/0337138 A1 | 11/2018 | Luu et al. | |
| 2019/0019099 A1 | 1/2019 | Hoskinson et al. | |
| 2019/0044044 A1 | 2/2019 | Lampert et al. | |
| 2019/0044048 A1* | 2/2019 | George | H01L 29/66977 |
| 2019/0164959 A1 | 5/2019 | Thomas et al. | |
| 2019/0288176 A1 | 9/2019 | Yoscovits et al. | |
| 2019/0332965 A1 | 10/2019 | Barends | |
| 2019/0369171 A1 | 12/2019 | Swenson et al. | |
| 2020/0012961 A1 | 1/2020 | Kelly et al. | |
| 2020/0144476 A1 | 5/2020 | Huang et al. | |
| 2020/0152851 A1 | 5/2020 | Lanting et al. | |
| 2020/0266234 A1 | 8/2020 | Boothby et al. | |
| 2021/0190885 A1 | 6/2021 | Swenson et al. | |
| 2021/0375516 A1 | 12/2021 | Sterling et al. | |
| 2022/0123048 A1 | 4/2022 | Swenson et al. | |
| 2023/0004851 A1 | 1/2023 | Harris et al. | |

FOREIGN PATENT DOCUMENTS

| | | | |
|---|---|---|---|
| CN | 102334206 A | 1/2012 | |
| CN | 105914219 A | 8/2016 | |
| EP | 0329603 A2 | 8/1989 | |
| EP | 0437971 A1 | 7/1991 | |
| EP | 0466611 A1 | 1/1992 | |
| EP | 0476844 A1 | 3/1992 | |
| EP | 0477495 A1 | 4/1992 | |
| EP | 0732756 A2 | 9/1996 | |
| EP | 0756335 A1 | 1/1997 | |
| EP | 2401776 B1 | 8/2016 | |
| JP | S60140885 A | 7/1985 | |
| JP | S6215869 A | 1/1987 | |
| JP | S6257263 A | 3/1987 | |
| JP | S62200777 A | 9/1987 | |
| JP | 63007675 A | 1/1988 | |
| JP | S637675 A | 1/1988 | |
| JP | S63226981 A | 9/1988 | |
| JP | S6411357 U | 1/1989 | |
| JP | S6476610 A | 3/1989 | |
| JP | H027583 A | 1/1990 | |
| JP | H03286578 A | 12/1991 | |
| JP | H04246871 A | 9/1992 | |
| JP | H04334074 A | 11/1992 | |
| JP | H05102547 A | 4/1993 | |
| JP | H05114756 A | 5/1993 | |
| JP | H06260692 A | 9/1994 | |
| JP | H07066462 A | 3/1995 | |
| JP | H07245404 A | 9/1995 | |
| JP | H08236823 A | 9/1996 | |
| JP | H104223 A | 1/1998 | |
| JP | 2001516970 A | 10/2001 | |
| JP | 2001516970 T | 10/2001 | |
| JP | 2003092436 A | 3/2003 | |
| JP | 2004-079882 | 3/2004 | |
| JP | 2004079882 A | 3/2004 | |
| JP | 2004519102 A | 6/2004 | |
| JP | 2005-39244 A | 2/2005 | |
| JP | 2005039244 A | 2/2005 | |
| JP | 2007150257 A | 6/2007 | |
| JP | 2009111306 A | 5/2009 | |
| JP | 2012519379 A | 8/2012 | |
| JP | 6059754 B2 | 12/2016 | |
| KR | 20000026669 A | 5/2000 | |
| KR | 20010067425 A | 7/2001 | |
| KR | 20190035900 A | 4/2019 | |
| WO | 99/14800 A1 | 3/1999 | |
| WO | 0201327 A2 | 1/2002 | |
| WO | 02069411 A2 | 9/2002 | |
| WO | 2005093649 A1 | 10/2005 | |
| WO | 2007085074 A1 | 8/2007 | |
| WO | 2008138150 A1 | 11/2008 | |
| WO | 2009120638 A2 | 10/2009 | |
| WO | 2009149086 A2 | 12/2009 | |
| WO | 2013180780 A2 | 12/2013 | |
| WO | 2016025598 A1 | 2/2016 | |
| WO | 2016183213 A1 | 11/2016 | |
| WO | WO-2017192733 A2 * | 11/2017 | G06N 10/00 |
| WO | 2018144601 A1 | 8/2018 | |
| WO | 2019055002 A1 | 3/2019 | |
| WO | 2019179732 A1 | 9/2019 | |
| WO | 2020212437 A1 | 10/2020 | |
| WO | 2021231224 A1 | 11/2021 | |
| WO | 2021262741 A1 | 12/2021 | |
| WO | 2022178130 A1 | 8/2022 | |

OTHER PUBLICATIONS

Dhakal, et al., "Flux expulsion in niobium superconducting radio-frequency cavities of different purity and essential contributions in the flux sensitivity", arXiv:1906.04163, Pub. Jun. 6, 2019.

Henry, et al., "Degradation of Superconducting Nb/NbN Films by Atmospheric Oxidation", IEEE Transactions on Applied Superconductivity, IEEXplore, 1051-8223, 2017, 5 pages.

Hu, "Advanced Composites Material" pp. 197-201—Chinese, 2019.

Martinis, et al., "Decoherence in Josephson Qubits from Dielectric Loss", arXiv:cond-mat/0507622v1 [cond-mat.mtrl-sci] Jul. 26, 2005.

Semenov, et al., "How Moats Protect Superconductor Films from Flux Trapping", IEEE Transactions on Applied Superconductivity, 1051-8223, 2016 IEEE, 20 pages.

Semenov., "AC-Biased Shift Registers as Fabrication Process Benchmark Circuits and Flux Trapping Diagnostic Tool", arXiv:1701.03837, Published Dec. 29, 2016, 9 pages.

Doerner, S., et al., "Compact microwave kinetic inductance nanowire galvanometer for cryogenic detectors at 4.2 K," J. Phys. Commun., 2018, 8 pages.

Peltonen, J.T., et al., "Hybrid rf SQUID qubit based on high kinetic inductance," Scientific Reports, Jul. 3, 2018, 8 pages.

Tolpygo, Sergey K., et al., "Superconductor Electronics Fabrication Process with MoNx Kinetic Inductors and Self-Shunted Josephson Junctions," IEEE Transactions on Applied Superconductivity 28(4), Jun. 2018, 12 pages.

Written Opinion for PCT/US2020/018137, mailed Jun. 3, 2020, 10 pages.

Müller et al., "Towards understanding two-level-systems in amorphous solids—Insights from quantum circuits", arXiv:1705.01108v3, Oct. 10, 2019.

Makhlin et al., "Quantum-state engineering with Josephson-junction devices," Reviews of Modern Physics 73 (2):357-400, Apr. 2001.

(56) References Cited

OTHER PUBLICATIONS

Malissa et al., "Superconducting coplanar waveguide resonators for low temperature pulsed electron spin resonance spectroscopy", Review of Scientific Instruments, Feb. 1, 2013.

Martens et al., "Sparameter measurements on singe superconducting thin-film three-terminal devices made of high-Tc and low-Tc materials", J. Appl. Phys. 65, 1989.

Mason, "Surface Impedance of Thin Superconducting Films", California Institute of Technology, 1962.

McRae et al., "Materials loss measurements using superconducting microwave resonators", arXiv:2006.04718 [physics, physics:quant-ph], Sep. 1, 2000.

Mooij et al., "Josephson Persistent-Current Qubit," Science 285:1036-1039, Aug. 13, 1999.

Morton & Bertet, "Storing quantum information in spins and high-sensitivity ESR", Journal of Magnetic Resonance, 287:128-139, Feb. 1, 2018.

N/A, "Antifuse", Wikipedia, Nov. 16, 2019.

N/A, "Low-k dielectric", Wikipedia, Apr. 14, 2020.

Niepce et al., "Geometric scaling of two-level-system loss in superconducting resonators", Superconducting Science and Technology, 33(2):025013, Jan. 1, 2020.

NSA, "Superconducting Technology Assessment", National Security Agency Office of Corporate Assessments, Aug. 1, 2005, 257 pages.

Office Action in Application No. 2019-562235, mailed Mar. 11, 2022 (English translation, 5 pages).

Oliver et al., "MRS Bulletin" vol. 38, pp. 816-825 (2013).

Place et al., "New material platform for superconducting transmon qubits with coherence times exceeding 0.3 milliseconds", arXiv, Feb. 28, 2020.

Place et al., "Supplementary Materials for New material platform for superconducting transmon qubits with coherence times exceeding 0.3 milliseconds", Feb. 1, 2021.

Ramzi et al., "Niobium and Aluminum Josephson Junctions Fabricated with a Damascene CMP Process", Physics Procedia, vol. 36, 2012, p. 211-216.

Schulz et al., "Design and realization of an all d-wave dc pi-superconducting quantum interference device", Appl. Phys. Lett. 76, 2000.

Schuster et al., "High cooperativity coupling of electron-spin ensembles to superconducting cavities", Physical Review Letters, 105(14):140501, Sep. 1, 2010.

Sears, "Extending Coherence in Superconducting Qubits: from microseconds to milliseconds", PhD thesis, Yale, Jan. 1, 2013.

Sigillito et al., "Fast, low-power manipulation of spin ensembles in superconducting microresonators", Applied Physics Letters, 104(22):222407, Jun. 1, 2014.

Sun et al., "Direction of tunneling in Pb/ I /YBa2Cu3O7-x tunnel junctions", Phys Rev B 54, 1996.

Swenson et al., "Operation of a titanium nitride superconducting microresonator detector in the nonlinear regime," arXiv:1305.4281v1 [cond-mat.supr-con], May 18, 2013, 11 pages.

Tokunaga et al., "SiO2 passivation film effects on YBCO junctions", Science Direct, Sep. 10, 1998.

Tolpygo et al., "Advanced Fabrication Processes for Superconducting Very Large Scale Integrated Circuits," IEEE Transactions on Applied Superconductivity 26(3):1-10, Jan. 19, 2016.

Tolpygo et al., "Deep sub-micron stud-via technology of superconductor VLSI circuits," Supercond. Sci. Technol. 27:1-9, Jan. 14, 2014.

Valles et al., "Electron tunneling into single crystals of YBa2Cu3O7-δ", Phys. Rev. B 44, 1991.

Verjauw et al., "Investigation of microwave loss induced by oxide regrowth in high-Q Nb resonators", Physical Review Applied, p. 16, Jan. 1, 2020.

VLSI-expert.com, "Parasitic Interconnected Corner (RC corner) Basics—Part 1", hhtp:www.visi-expert.com/2012/02/parasitic-interconnected-corner-rc-corner.html, Feb. 12, 2012 (Year:2012), 7 pages.

Voesch et al., "On-Chip ESR Measurements of DPPH at mK Temperatures", Physics Procedia, 75:503-510, Jan. 1, 2015.

Voss et al., "Submicron Nb—Al-oxide-Nb junctions for frequency mixers", Superconductor Science and Technology 6, 1993.

Wallace & Silsbee, "Microstrip resonators for electron-spin resonance", Review of Scientific Instruments, 62 (7):1754-1766, Jul. 1, 1991.

Wang et al., "FTIR Characterization of Fluorine Doped Silicon Dioxide Thin Films Deposited by Plasma Enhanced Chemical Vapor Deposition", IOP Science, Apr. 21, 2000.

Weichselbaumer et al., "Quantitative modeling of superconducting planar resonators with improved field homogeneity for electron spin resonance", Physical Review Applied, 12(2):024021, Aug. 1, 2019.

Winkel, "Implementation of a transmon qubit using superconducting granular aluminum", arXiv, Nov. 7, 2019.

Woods et al., "Determining interface dielectric losses in superconducting coplanar waveguide resonators", arXiv:1808.10347 [cond-mat,physics:quant-ph], Aug. 1, 2018.

Written Opinion for PCT/US2018/016237, mailed Jul. 2, 2018, 30 pages.

Whittaker, J.D. , et al., "A frequency and sensitivity tunable microresonator array for high-speed quantum," arXiv:1509.05811v2 [quant-ph], Apr. 22, 2016, 8 pages., Apr. 22, 2016.

Non Final Office Action for U.S. Appl. No. 17/681,303, mailed May 17, 2023, 13 pages.

D-Wave Whitepaper, Early Progress on Lower Noise, 2022.

Fritzsch et al., "SNS and SIS Josephson junctions with dimensions down to the sub-μm region prepared by an unified technology," Supercond. Sci. Tech. 12: 880-882, 1999.

Gao et al., A Semiempirical Model For Two Level System Noise In Superconducting Microresonators, Applied Physics, 2008.

International Search Report and Written Opinion, mailed Oct. 13, 2021. for PCT/US2021/038519, 9 pages.

Kauppinen, et al., "Coulomb Blockade Thermometer: Tests and Instrumentation", Review of Scientific Instruments, vol. 69, #12, 1998.

Kosen, et al., "Building Blocks of a Flip Chip Integrated Superconducting Quantum Processor", arXiv 2112.02717v2, 2022.

Lee, "The Feasibility of Au Bonding on SN-Plated Cu", Journal of Electronic Materials, 2007.

Logothetidis, et al., "Room Temperature Oxidation Behavior of TiN Thin Films", 1999.

Luo, "Superconductivity In Noble-Metal-Rich Hexagonal Close-Packed Phases", 1970.

McCrory, et al., "Wafer-Level Electrically Detected Magnetic Resonance: Magnetic Resonance In A Probing Station", 2018.

Mcintyre, "The Effect Of Annealing And Heating Deposition On Alpha And Beta Phase Formation For Tantalum Thin Films", 2018.

Narkowicz, et al., "Planar Microresonators For EPR Experiments", Science Direct, 2005.

Ni, et al., "Demonstration Of Tantalum As A Structural Material For MEMS Thermal Actuators", 2021.

Non-Final Office Action Issued in U.S. Appl. No. 16/870,537, mailed Jul. 19, 2023, 9 pages.

Shoji et al., "New fabrication process for Josephson tunnel junctions with (niobium nitride, niobium) double-layered electrodes," Appl. Phys. Lett. 41(11): 1097-1099, Dec. 1, 1982.

Veinger, "Technique For Magnetic Susceptibility Determination in the High Doped Semiconductors by Electron Spin Resonance", 2013.

Vladoiu, "Growth and Characteristics of Tantalum Oxide Thin Films Deposited Using Thermionic Vacuum Arc Technology", 2010.

Wang, "Towards Practical Quantum Computers: Transmon Qubit With a Lifetime Approaching 0.5 Milliseconds", 2022.

Zednicek, "Niobium and Niobium Oxide Capacitors Overview", 2019.

Zhang, et al., "Characterization of Surface Oxidation Layers On Ultrathin NvTiN Films", 2018.

Racah et al., "Properties of normal metal/dielectric/high-Tcjunctions obtained by in-situ oxidation", Physica C 263, 1996.

Chinese Office Action dated Mar. 30, 2023, for Chinese Application No. 201880021010X, 12 pages (English translation of action).

(56) References Cited

OTHER PUBLICATIONS

Barends, et al., "Superconducting quantum circuits at the surface code threshold for fault tolerance", Nature vol. 508, pp. 500-503 (2014).
Blatter et al., "Design aspects of superconducting-phase quantum bits," Physical Review B 63: 174511-1-174511-9, 2001.
Bunyk et al., "Architectural Considerations in the Design of a Superconducting Quantum Annealing Processor," IEEE Trans. Appl. Supercond., 24, arXiv:1401.5504v1 [quant-ph] Jan. 21, 2014, 9 pages.
Calusine et al., "Analysis and mitigation of interface losses in trenched superconducting coplanar wave resonators", Applied Physics Letters, 112(6):062601, Feb. 1, 2018.
Cava, et al., "Electrical and magnetic properties of $Nb_2O_5$-crystallographic shear structures", Phys. Rev. B44, 6973—Published Oct. 1, 1991.
Clauss et al., "Broadband electron spin resonance from 500 MHz to 40 GHz using superconducting coplanar waveguides", Applied Physics Letters, Apr. 1, 2013.
Clauss et al., "Optimization of Coplanar Waveguide Resonators for ESR Studies on Metals", Journal of Physics: Conference Series, Mar. 1, 2015.
Daalmans, "HTS DC SQUIDs for practical applications", Science Direct, Jul. 1, 1995.
De Graaf et al., "Direct Identification of Dilute Surface Spins on $Al_2O_3$: Origin of Flux Noise in Quantum Circuits", Physical Review Letters, Jan. 1, 2017.
de Graaf et al., "Suppression of low-frequency charge noise in superconducting resonators by surface spin desorption", Nature Communications, 9(1):1143, Dec. 1, 2018.
Diniz et al., "Intrinsic photon loss at the interface of superconducting devices", arXiv, Mar. 10, 2020.
Extended European Search Report for EP 18747996.5, dated Sep. 3, 2020, 8 pages.
Friedrich et al., "Onset of phase diffusion in high kinetic inductance granular aluminum micro-SQUIDs", arXiv, Aug. 29, 2019.
Gao et al., "Experimental evidence for a surface distribution of two-level systems in superconducting lithographed microwave resonators", Applied Physics Letters, 92(15):152505, Apr. 1, 2018.
Gao, Jiansong, "The Physics of Superconducting Microwave Resonators," Thesis, In Partial Fulfillment of the Requirements for the Degree of Doctor of Philosophy, California Institute of Technology Pasadena, California, May 28, 2008, 197 pages.
Hinode et al., "Fabrication of reliable via conductors for niobium SFQ devices," Physica C 426-431:1533-1540, 2005.
Holzman et al., "On-chip integrable planar NbN nanoSQUID with broad temperature and magnetic-field operation range", AIP Advances, Oct. 23, 2019.
Hori et al., "Electron spin resonance study on pure single crystalline sapphire", P hys. Status Solidi C 10, No. 12, 1681-1683 (Nov. 5, 2013).
Hunt et al., "NbN/MgO/NbN edge-geometry tunnel junctions", Applied Physics Letters 55, 1982.
International Search Report for PCT/US2018/016237, mailed Jul. 2, 2018, 6 pages.
International Search Report for PCT/US2020/018137, mailed Jun. 3, 2020, 4 pages.
Japanese Office Action for Japanese Patent Application No. 2020-073654, mailed Aug. 17, 2021 (with English Translation) 5 pages.
Kwon et al., "Magnetic Field Dependent Microwave Losses in Superconducting Niobium Microstrip Resonators", Journal of Applied Physics, 124(3):033803, Jul. 1, 2018.
Lanting et al., "Evidence for temperature-dependent spin diffusion as a mechanism of intrinsic flux noise in SQUIDs", Physical Review B 89, 014503 (Jan. 7, 2014).
Lanting et al., "Geometrical dependence of the low-frequency noise in superconducting flux qubits", Physical Review B, 79, 060509, Jun. 5, 2009, 4 pages.
Levy-Bertrand et al., "Electrodynamics of granular aluminum from superconductor to insulator: observation of collective superconducting modes", arXiv, Mar. 13, 2019.
Lomatch et al., "Multilayer Josephson Flux Quantum Devices," IEEE Trans. Appl. Superconductivity, vol. 5, No. 2, Jun. 2, 1995.
Lucero, "Computing prime factors using a Josephson phase-qubit architecture: 15=3x5", A dissertation submitted in partial satisfaction of the requirements for the degree of Doctor of Philosophy in Physics, University of California Santa Barbara.
Il'ichev, et al. "Degenerate ground state in a mesoscopic $YBa_2Cu_3O_7$-x grain boundary Josephson junction", Physical Review Letters, vol. 86, No. 23, Jun. 4, 2001, 4 pages.
Annunziata, et al., "Tunable superconducting nanoinductors", IOP Science, Oct. 15, 2010, 11 pages.
Balashov, et al., "Superconductor-insulator-normal-conductor-insulator-superconductor process development for integrated circuit applications", IOP Science, Dec. 1, 1998, 11 pages.
Bruder, et al., "Tunnel junctions of Unconventional Superconductors", Physical Review, 1995, 5 pages.
Larsson, et al., "Transport properties of submicron $YBa_2Cu_3O_7$-d step-edge Josephson junctions", J. Appl. Phys. 90, 2001, 24 pages.
Lombardi, et al., "Tunnel barriers for an all-high-Tc single electron tunneling transistor", Physica C 368, 2002, 6 pages.
Martinis, et al., "UCSB final report for the CSQ program: Review of decoherence and materials physics for superconducting qubits", arXiv, Oct. 21, 2014, 10 pages.
Mazin, et al., "Thin film dielectric microstrip kinetic inductance detectors", arXiv, Feb. 1, 2010, 10 pages.
Ortlepp, et al., "RSFQ Circuitry Using Intrisic Tr-Phase Shifts", IEEE, Jun. 2007, 5 pages.
Schrieffer, et al., "Superconductivity", Rev. Mod. Phys., 71, 1999, 5 pages.
Sigrist, et al., "Unusual paramagnetic phenomena in granula high-temperature superconductors—A consequence of d-wave pairing?", Rev. Mod. Phys. 67, 1995, 5 pages.
Smilde, et al., "Y—Ba—Cu—O / Au / Nb Ramp-type Josephson Junctions", IEEE, 2001, 5 pages.
Tanaka, et al., "Theory of Josephson effects in anisotropic superconductor", Physical Review B 56, 1997, 21 pages.
Tolpygo, "Superconductor Digital Electronics: Scalability and Energy Efficiency Issues", arXiv, Feb. 10, 2016, 20 pages.
Tosi, et al., "Silicon quantum processor with robust long-distance qubit couplings", Nature, Sep. 6, 2017, 11 pages.
Bronn, et al., "High Coherence Plane Breaking Packaging for Superconducting Qubits", arXiv: 1709.02402v2 [quant-ph] Feb. 14, 2018, 101 pages.
Chapter: Appendix C: Superconducting Quantum Computers, Quantum, Computing Progress and Prospects, the National Academies Press, 2019, 10 pages.
Chen et al., "Qubit architecture with high coherences and fast tunable coupling", Physical Review Letters, Feb. 28, 2014. https://arxiv.org/abs/1402.7367.
deGraaf, et al., "Suppression of low-frequency charge noise in superconducting resonators by surface spin desorption", Supplementary Information, 8 pages.
Elsherbini, et al., "Flip Chip Packaging for Superconducting Quantum Computers", APS-APS March Meeting 2018—Event—vol. 63, No. 1, 1 page.
Fourie, et al., "Wk2EOr3B-05—Experimental verification of moat design and flux trapping analysis", Stellenbosch University, ASC 2020, Virtual Conference, Nov. 4, 2020.
Foxen, et al., Qubit compatible superconducting interconnects, arXiv:1708.04270v2 [quant-ph], Sep. 29, 2017, 19 pages.
Fritz, et al., "Optimization of Al/AlOx/Al-layer systems for Josephson Junctions from a microstructure point of view", Journal of Applied Physics, 125, 165301 (2019). 11 pages.
Gargiulo, et al., "Fast flux control of 3D transmon qubits using a magnetic hose", : Appl. Phys. Lett. 118, 012601 (2021); https://doi.org/10.1063/5.0032615, 7 pages.
Hilton, et al., "Fabrication of prototype imaging arrays for SCUBA-2", Preprint submitted to Elsevier Science, Oct. 3, 2005.
Hsu_"CES 2018 Inte'ls 49-Qubit Chip Shoots for Quantum Supremacy", IEEE Spectrum, 4 pages.

(56) References Cited

OTHER PUBLICATIONS

Kamal., et al., "Improved superconducting qubit coherence with high-temperature substrate annealing", arXiv:1606.09262v1 [cond-mat.mes-hall] Jun. 29, 2016, 10 pages.
Koch, et al., "Charge-insensitive qubit design derived from the Cooper pair box", Physical Review A 76, 042319 (2007), 19 pages.
Lei, et al., "High coherence superconducting microwave cavities with indium bump bonding", Appl. Phys. Lett. 116, 154002 (2020), 6 pages.
MIT, "Superconducting Integrated Circuits", Lincoln Laboratory, Technology in Support of National Security, 2 pages.
Narayana, et al., "Design and testing of high-speed interconnects for Superconducting multi-chip modules", MIT Lincoln Laboratory, 244 Wood Street, 2012, 16 pages.
Nguyen et al., "The high-coherence fluxonium qubit", arXiv:1810.11006v1, Oct. 25, 2018.
Rich, "DC SQUID Magnetometry", Christopher Bennett Rich 2019 Thesis, Simon Fraser University Fall 2019, 58 pages.
Rosenberg, et al., "3D integrated superconducting qubits", arXiv:1706.04116v2 [quant-ph] Jun. 19, 2017, 6 pages.
Sharma, "Fabrication and Characterization of AL/ALOx/AL Josephson Junctions", Mater of Science, Texas A&M University, Dec. 2015, 84 pages.
Shen, et al., "Character and fabrication of Al/al2o3/al tunnel junctions for qubit application", Chinese Science Bulletin, Feb. 2012 Vo. 57 No. 4: 409-412.
Steffen, et al., "Recent research trends for high coherence quantum circuits", IOP Publishing, Supercond. Sci. Technol, 30 (2017), 5 pages.
Tolpygo, et al., "Process-Induced Variability of Nb/Al/Alox/Nb Junctions in Superconductor Integrated Circuits and Protection Against It", IEEE Transactions On Applied Superconductivity, vol. 19, No. 3, Jun. 2009, 5 pages.
Toplygo, et al., "Wafer Bumping Process and Inter-Chip Connections for Ultra-High Data Transfer Rates in Multi-Chip Modules With Superconductor Integrated Circuits", IEEE Transactions On Applied Superconductivity, 2009, 5 pages.
Tournet, "Growth and Characterization of Epitaxial Al Layers on GaAs and Si Substrates for Superconducting CPW Resonators in Scalable Quantum Computing Systems", Thesis 2015, 161 pages.
Weides, et al., "Phase qubits fabricated with trilayer junctions", 7 pages.
Blanquart et al., et al., "Evaluation and Comparison of Novel Precursors for Atomic Layer Deposition of Nb2O5 Thin Films", Chem. Mater., Feb. 8, 2012, 6 pages.
Born, et al., "Fabrication of Ultrasmall Tunnel Junctions by Electron Beam Direct-Writing", IEEE, 2001, 4 pages.
Buchholz, et al., "LTS junction technology for RSFQ and qubit circuit applications", Science Direct, Jul. 24, 2006, 8 pages.
Campbell, et al., "Dynamics of Oxidation of Aluminum Nanoclusters using Variable Charge Molecular-Dynamics Simulations on Parallel Computers", APS Physics, Jun. 14, 1999, 4 pages.
Chan, et al., "Interface between gold and superconducting YBa2Cu3O7-x", J. Mater. Res, 1995, 6 pages.
Cucolo, et al., "Linear normal conductance in copper oxide tunnel junctions", Phys. Rev. B 54, 1996, 3 pages.
Dagan, et al., "C-axis tunneling on YBCO films", Eur. Phys. J. B 19, 2001, 5 pages.
Dimos, et al., "Orientation Dependence of Grain-Boundary Critical Currents in YBa2Cu3O7 Biocrystals", Physical Review Letters, Jul. 11, 1988, 5 pages.
Dolata, et al., "Platinum thin film resistors with Cr under- and overlayers for Nb/Al2O3/Nb technology", Science Direct, Jul. 19, 2005, 4 pages.
Faucher, et al., "Niobium and niobium nitride SQUIDs based on anodized nanobridges made with an atomic force microscope", Science Direct, Mar. 1, 2002, 7 pages.
Geerlings, et al., "Improving the Quality Factor of Microwave Compact Resonators by Optimizing their Geometrical Parameters", Applied Physics Letters, 2012, 4 pages.
Grabert, et al., "Mesoscopic Josephson effect", Superlattices and Microstructures 25, 2019, 10 pages.
Grünhaupt, et al., "Granular aluminum: A superconducting material for high impedance quantum circuits", arXiv, Sep. 27, 2018, 9 pages.
Grünhaupt, et al., "Quasiparticle dynamics in granular aluminum close to the superconductor to insulator transition", arXiv, Feb. 7, 2018.
Hadfield, et al., "Novel Josephson junction geometries in NbCu bilayers fabricated by focused ion beam microscope", Physica C, North-Holland Publishing, Amsterdam, Feb. 15, 2002, 9 pages.
Harris, "Improved coherence leads to gains in quantum annealing performance", D-Wave, 2019, 4 pages.
Havemann, et al., "High-performance interconnects: an integration overview", IEEE, May 2001, 16 pages.
Herr, et al., "Reproducible Operating Margins on a 72,800-Device Digital Superconducting Chip", arXiv, Oct. 5, 2015, 6 pages.
Hilgenkamp, et al., "Implications of dx2-y2 symmetry and faceting for the transport properties of grain boundaries in high-TC superconductors", Physical Review B 53, 1996, 8 pages.
Hinode, et al., "Fabrication of reliable via conductors for niobium SFQ devices", Science Direct, Jul. 19, 2005, 8 pages.
Hypres, "Niobium Integrated Circuit Fabrication Process #S45/100/200 Design Rules", Hypres, Mar. 10, 2015, 9 pages.
Iguchi, et al., "Experimental evidence for a d-wave pairing state in YBa2Cu3O7-y from a study of YBa2Cu3O7-y/insulator/Pb Josephson tunnel junctions", Phys. Rev. B 49, 1994, 4 pages.
Il'ichev, et al., "Nonsinusoidal Current-Phase Relationship of Grain Boundary Josephson junctions in High-Tc Superconductors", Physical Review Letters 81, 1998, 4 pages.
Joyez, et al., "Observation of Parity-Induced Suppression of Josephson Tunneling in the Superconducting Single Electron Transistor", Phys. Rev., Lett. 72, Jul. 19, 2005, 5 pages.
Koelle, et al., "High-transition-temperature superconducting quantum interference devices", Reviews of Modern Physics 71, 199, 56 pages.
Kohl, "Low-Dielectric Constant Insulators for Future Integrated Circuits and Packages", Georgia Tech, Mar. 14, 2011, 25 pages.
Kouznetsov, et al., "c-axis Josephson Tunneling between YBa2Cu3O7-δ and Pb: Direct Evidence for Mixed Order Parameter Symmetry in a High-Tc Superconductor", Phys. Rev. Lett. 79, 1997, 4 pages.
Kubatkin, et al., "Coulomb blockade electrometer with a high-Tcisland", JETP Letters 63, 1996, 7 pages.
Levinsen, "Electromagnetic properties of the Dayem bridge", HAL Archives, Jan. 1, 1974, 11 pages.
Maleeva, et al., "Circuit Quantum Electrodynamics of Granular Aluminum Resonators", arXiv, Feb. 7, 2018, 17 pages.
Martinis, et al., "Critical Field for Complete Vortex Expulsion from Narrow Superconducting Strips", UCSB, Mar. 5, 2004, 4 pages.
Matveev, et al., "Parity-Induced Suppression of the Coulomb Blockade of Josephson Tunneling", Phys. Rev. Lett. 70, 1993, 4 pages.
Mckenney, et al., "Design considerations for a background limited 350 micron pixel array using lumped element superconducting microresonators", SPIE, Sep. 24, 2012, 10 pages.
Nagasawa, et al., "Development of advanced Nb process for SFQ circuits", Science Direct, Jun. 9, 2004, 8 pages.
Potts, et al., "CMOS compatible fabrication methods for submicron Josephson junction qubits" IEEE, Sep. 5, 2001, 4 pages.
Russo, et al., "Characterization of Superconducting Thin Films and nanoSQUIDs for Nanoparticle Investigation at High Magnetic Field", IEEE, Feb. 18, 2012, 4 pages.
Satoh, et al., "Fabrication process of planarized multi-layer Nb Integrated circuits", IEEE, Jun. 13, 2005, 4 pages.
Satoh, et al., "Planarization of Josephson junctions for large-scale integrated Nb SFQ circuits by mechanical polishing", Science Direct, 1999, 4 pages.
Tafuri, et al., "Feasibility of Blepitaxial YbaCuO Josephson Junctions for Fundamental Studies and Potential Circuit Implementation", Los Alamos National Laboratory preprint server condmat, Dec. 18, 2002, 21 pages.

(56) References Cited

OTHER PUBLICATIONS

Tolpygo, et al., "Deep Sub-Micron Stud-Via Technology for Superconductor VLSI Circuits", IOP Science, Jan. 14, 2014, 10 pages.

Tsuei, et al., "Pairing symmetry in cuprate superconductors", Reviews of Modern Physics 72, 2000, 48 pages.

Valenti, et al., "Interplay between kinetic inductance, non-linearity and quasiparticle dynamics in granular aluminum MKIDs", arXiv, Nov. 10, 2018, 14 pages.

Van Harlingen, "Phase-sensitive tests of the symmetry of the pairing state in the high-temperature superconductors—Evidence for dx2-y2 symmetry", Rev. Mod. Phys. 67, 1995, 23 pages.

Vinante, et al., "Hot-electron effect in palladium thin films", APS Physics, Mar. 13, 2007, 5 pages.

Wen, et al., "Microstructure of ramp-edge Yba2Cu3O3/PrBa2Cu3O2 Josephson junctions on different substrates", Physica C 255, 1995, 13 pages.

Wollman, et al., "Evidence for dx2-y2 Pairing from the Magnetic Field Modulation of YBa2Cu3O7—Pb Josephson Junctions". Phys. Rev. Lett 74, Jan. 30, 1995, 4 pages.

Yohannan, "Characterization of alpha and beta phases of tantalum coatings", New Jersey Institute of Technology, Aug. 31, 2001, 107 pages.

Zantye, Parshuram B, et al., "Chemical mechanical planarization for microelectronics application", Materials Science and Engineering R 45 (2004) 89-220. 2004 (Year: 2004), 132 pages.

Anlage, et al., "A current controlled variable delay superconducting transmission line", IEEE, pp. 1388-1391.

Berkley, et al., "A scalable readout system for a superconducting adiabatic quantum optimization system", arXiv, May 6, 2009, 18 pages.

Dagan, et al., "Absence of Andreev reflections and Andreev bound states above the critical temperature", Phys. Rev. B 61, 2000, 5 pages.

Eom, et al., "A Wideband, Low-Noise Superconducting Amplifier with High Dynamic Range", arXiv, Jan. 11, 2012, 23 pages.

Kerber, et al., "An improved NbN integrated circuit process featuring thick NbN ground plane and lower parasitic circuit inductances", IEEE, Jun. 1997, 6 pages.

Lisitskii, et al., "Annular Josephson junctions for radiation detection: fabrication and investigation of the magnetic behavior", Nuclear Instruments & Methods in Physics Research, Apr. 2000, 11 pages.

Macco, et al., "Atomic-layer deposited Nb2O5 as transparent passivating electron contact for c-Si solar cells", Science Direct, Sep. 2018, 7 pages.

Nicoletti, et al., "Bi-epitaxial YBCO grain boundary Josephson junctions on SrTIO3 and sapphire substrates", Physica C 269, 1996, 13 pages.

Tolpygo, et al., "Advanced Fabrication Processes for Superconducting Very Large-Scale Integrated Circuits", IEEE. Jan. 19, 2016.

Yoon, et al., "Atomic-scale chemical analyses of niobium oxide/niobium interfaces via atom-probe tomography", AIP Applied Physics Letters, Oct. 2, 2008, 3 pages.

Notice of Allowance for U.S. Appl. No. 17/321,819, mailed Nov. 8, 2023, 10 pages.

* cited by examiner

KINETIC INDUCTANCE FOR COUPLERS AND COMPACT QUBITS

FIELD

This disclosure generally relates to systems, methods, and devices for coupling qubits and forming compact qubits using a kinetic inductance material in an integrated circuit. The disclosed techniques can be applied to devices that constitute a superconducting processor, such as a quantum processor.

BACKGROUND

Quantum Devices

Quantum devices are structures in which quantum mechanical effects are observable. Quantum devices include circuits in which current transport is dominated by quantum mechanical effects. Such devices include spintronics, where electronic spin is used as a resource, and superconducting circuits. Both spin and superconductivity are quantum mechanical phenomena. Quantum devices can be used for measurement instruments, in computing machinery, and the like.

Quantum Computation

Quantum computation and quantum information processing are active areas of research and define classes of vendible products. A quantum computer is a system that makes direct use of at least one quantum-mechanical phenomenon, such as, superposition, tunneling, and entanglement, to perform operations on data. The elements of a quantum computer are quantum binary digits, known as qubits. Quantum computers hold the promise of providing exponential speedup for certain classes of computational problems such as computational problems simulating quantum physics. Useful speedup may exist for other classes of problems.

One model of quantum computing is adiabatic quantum computing. Adiabatic quantum computing can be suitable for solving hard optimization problems, for example. Further details on adiabatic quantum computing systems, methods, and apparatus are described, for example, in U.S. Pat. Nos. 7,135,701 and 7,418,283.

Quantum Annealing

Quantum annealing is a computational method that may be used to find a low-energy state of a system, typically preferably the ground state of the system. Similar in concept to classical simulated annealing, the method relies on the underlying principle that natural systems tend towards lower energy states because lower energy states are more stable. While classical annealing uses classical thermal fluctuations to guide a system to a low-energy state, quantum annealing may use quantum effects, such as quantum tunneling, as a source of delocalization to reach an energy minimum more accurately and/or more quickly than classical annealing. In quantum annealing, thermal effects and other noise may be present. The final low-energy state may not be the global energy minimum.

Adiabatic quantum computation may be considered a special case of quantum annealing. In adiabatic quantum computation, the system ideally begins and remains in its ground state throughout an adiabatic evolution. Thus, those of skill in the art will appreciate that quantum annealing systems and methods may generally be implemented on an adiabatic quantum computer. Throughout the present application, any reference to quantum annealing is intended to encompass adiabatic quantum computation unless the context requires otherwise.

Superconducting Qubits

A quantum processor can be a superconducting quantum processor that includes superconducting qubits. Wendin G. and Shumeiko V. S., "Superconducting quantum circuits, qubits and computing" (arXiv:cond-mat/0508729v1, 2005), provides an introduction to the physics and principles of operation of quantized superconducting electrical circuits for quantum information processing.

Coupling

Couplers (also referred to in the present application as coupling devices) can provide communicative coupling between devices, for example qubits in a quantum processor. Coupling can be between adjacent and/or non-adjacent qubits. Unless expressly indicated otherwise, as used herein and in the claims, the terms couple, couples, coupling and variations of such means direct or indirect communicative coupling or communications between two or more devices or two or more components of a circuit.

Quantum Flux Parametron

The quantum flux parametron (QFP) is a superconducting Josephson junction device similar in structure to the compound rf-SQUID. The name "quantum flux parametron", can encompass both the operation and the structure of the Josephson junction device. A particular potential energy curve may be generated with a QFP device. This potential energy curve may resemble a "W" where the central peak or "barrier" is adjustable in height, as are the independent depths of the two wells on either side of the central barrier. In superconducting circuits, the QFP may be implemented as a magnetic flux-based logic device. It follows that QFP devices may be used to implement superconducting shift registers, superconducting memory arrays, superconducting adders, superconducting flip-flops, and other logic-based circuits. Shift registers comprising QFP devices are typically designed to transfer data along a relatively long distance in a superconducting circuit. For example, a shift register may transfer data from devices at the center of a processor to the periphery of the processor where bonding pads, which electrically couple the processor to input/output electronic components, are located.

Kinetic Inductance

Qubits are the fundamental building block of most quantum processors. It is desirable for qubits to have certain features to achieve optimal or close to optimal solutions in quantum computation. For example, it can be advantageous for a qubit to occupy minimal circuit area while still having parameters that are highly reproducible. It can also be desirable for a qubit to couple to other qubits with minimal parasitic impedance. Finally, qubits that are sufficiently isolated from noise sources can be less susceptible to quantum state decoherence.

Superconducting qubits are commonly used in quantum processors. One approach to achieving the aforementioned features in superconducting qubits is to use a kinetic inductance material. Kinetic inductors store energy in the kinetic energy of charge carriers. In a non-superconducting metal, this mechanism is suppressed due to scattering. However, in a superconducting metal, scattering at energies below the gap energy of the superconducting metal is prohibited due to the bosonic nature of the charge carriers. This phenomenon allows kinetic inductance to efficiently store energy within the superconducting metal.

A kinetic inductance that is common in superconducting electronics is the Josephson inductance. Many existing qubit and coupler designs utilize Josephson Junctions (JJs) in the body loop to shape the potential and anharmonicity. However, Josephson junctions are very sensitive to local heating during fabrication and atomic defects within the junction. Such sensitivities make these devices prone to large variations between wafers and within die of a wafer. Also, the critical current is very low for Josephson Junctions, which can result in nonlinear Josephson inductance. In some applications, such as parametric amplifiers and mixers, nonlinear Josephson inductance can be an attribute. However, nonlinear Josephson inductance is a parasitic effect in most applications, particularly when used as a coupling inductance in a coupler or when realizing the inductive portion of an ancilla qubit potential.

A common approach for coupling qubits and other superconducting devices is to use magnetic coupling (sometimes also referred to as inductive coupling). Magnetic coupling occurs when a superconducting metal is brought in proximity to another superconducting metal. However, integrated circuits that use magnetically coupled qubits generally require precise dielectric layer thicknesses. A precise dielectric layer thickness can be difficult to achieve using existing integrated circuit fabrication techniques. It is typically easier to fabricate a precise metal layer thickness and line width than to fabricate a precise dielectric thickness. A magnetic inductor can occupy a large circuit area and can vary significantly across a die due to dielectric thickness variations.

There is thus a general desire for systems and methods relating to superconducting device designs that are parametrically reproducible using existing integrated circuit fabrication techniques. There exists a need for superconducting devices that occupy minimal circuit area, can maintain coherence, and have low parasitic impedance.

The foregoing examples of the related art and limitations related thereto are intended to be illustrative and not exclusive. Other limitations of the related art will become apparent to those of skill in the art upon a reading of the specification and a study of the drawings.

BRIEF SUMMARY

There exists a need for superconducting quantum processors to include superconducting devices (e.g., qubits, couplers, etc.) that are reproducible and have minimal parasitic capacitance, and for compact qubits that can be used for error correction. In at least some implementations, the systems, methods, and devices described herein include superconducting devices that have a kinetic inductance material to achieve reproducibility and compactness.

A superconducting integrated circuit may be summarized as comprising: a first superconducting qubit comprising a first body loop; a second superconducting qubit comprising a second body loop; a first segment of kinetic inductance material interposed in the first body loop; a second segment of kinetic inductance material interposed in the second body loop; a coupler comprising a compound Josephson junction and a coupler body loop, the coupler body loop including the first segment of kinetic inductance material interposed in the first body loop and the second segment of kinetic inductance material interposed in the second body loop, wherein: the coupler is galvanically coupled to the first superconducting qubit by the first segment of kinetic inductance material; the coupler is galvanically coupled to the second superconducting qubit by the second segment of kinetic inductance material; and the first superconducting qubit, the second superconducting qubit, and the coupler each comprise at least one material that is superconductive in a range of temperatures below a respective critical temperature.

The first segment of kinetic inductance material and the second segment of kinetic inductance material may each comprise at least one of: TIN, NbN, NbTIN, WSi, and oxidized granular Al. The first body loop and the second body may each comprise at least one of: niobium and aluminum. The first superconducting qubit may, for example, be communicatively coupled to the second superconducting qubit by the coupler. The each of the first superconducting qubit and the second superconducting qubit may, for example, be superconducting flux qubits. The first superconducting qubit and the second superconducting qubit may, for example, each include a respective compound Josephson junction. The first superconducting qubit and the second superconducting qubit may, for example, each include a respective compound-compound Josephson junction.

A superconducting circuit may be summarized as comprising: a first qubit including a first qubit body loop, the first qubit body loop including a first qubit inductance; a second qubit including a second qubit body loop, the second qubit body loop including a second qubit inductance; a first segment of kinetic inductance material interposed in the first qubit body loop; a coupler including a coupler body loop, the coupler body including the first segment of kinetic inductance material interposed in the first qubit body loop, the coupler body loop including a plurality of coupling inductances, wherein: the coupler is magnetically communicatively coupled to the first qubit by a magnetic coupling of the first qubit inductance to a first one of the plurality of coupling inductances; the coupler is magnetically communicatively coupled to the second qubit by a magnetic coupling of the second qubit inductance to a second one of the plurality of coupling inductances; the coupler is galvanically coupled to the first qubit by the first segment of kinetic inductance material; the first qubit body loop, the second qubit body loop, and the coupler body loop are each interrupted by a respective Josephson junction; and the first qubit body loop, the second qubit body loop, and the coupler body loop each comprise at least one material that is superconductive in a range of temperatures below a respective critical temperature.

The superconducting circuit may further comprise a second segment of kinetic inductance material interposed in the second qubit body loop, wherein the coupler body loop further includes the second segment of kinetic inductance material interposed in the second qubit body loop, and the coupler is galvanically coupled to the second qubit by the second segment of kinetic inductance material. The at least one of the first qubit and the second qubit may, for example, further comprises a third qubit inductance, the second qubit communicatively coupled to the first qubit by a magnetic coupling of the third qubit inductance to a third one of the plurality of coupling inductances. The first qubit may, for example, be a superconducting flux qubit, and the second qubit may, for example, be a superconducting flux qubit. The first Josephson junction, the second Josephson junction, and the third Josephson junction may, for example, be respective compound Josephson junctions. The at least one of the first Josephson junction and the second Josephson junction may, for example, be a compound-compound Josephson junction.

A superconducting integrated circuit can be summarized as comprising: an upper layer including at least a portion of a first qubit body loop, the first qubit body loop comprising a first inductance, the first qubit loop comprising at least one material that is superconductive in a range of temperatures below a respective critical temperature; a first intervening layer including a first winding, the first winding comprising a second inductance, the first winding comprising a material that is superconductive in a range of temperatures below a respective critical temperature; a second intervening layer including at least a portion of a second qubit body loop, the second qubit body loop comprising a third inductance and a first segment of kinetic inductance material, the second qubit body loop comprising at least one material that is superconductive in a range of temperatures below a respective critical temperature; a lower layer carrying the upper layer, the first intervening layer, and the second intervening layer, the lower layer comprising a second winding, the second winding comprising the first segment of kinetic inductance material and a fourth inductance, the second winding comprising a material that is superconductive in a range of temperatures below a respective critical temperature, wherein: the first winding is magnetically coupled to the first qubit body loop by the first and the second inductances; the second winding is magnetically coupled to the second qubit body loop by the third and the fourth inductances; and the second winding is galvanically coupled to the second qubit body loop by the first segment of kinetic inductance material.

The first segment of kinetic inductance material may comprise at least one of: TIN, NbN, NbTIN, WSi, and oxidized granular Al. The at least one of the first qubit body loop and the second qubit body loop may, for example, be a loop of a first superconducting flux qubit. The first winding and the second winding may, for example, each comprise at least a portion of a coupler. The first winding may, for example, be superconducting electrically coupled to the second winding by a vertical interconnect access (via). The superconducting integrated circuit may further comprise an additional layer, the additional layer including a third winding, wherein the third winding is galvanically coupled to the second qubit body loop by a second segment of kinetic inductance material.

A superconducting integrated circuit can be summarized as comprising: a first wiring layer including at least a portion of a qubit body loop, the first wiring layer comprising a material that is superconductive in a range of temperatures below a respective critical temperature; a second wiring layer including at least a portion of a coupler body loop, the second wiring layer comprising a material that is superconductive in a range of temperatures below a respective critical temperature; a kinetic inductance layer including a shared conductive trace, the shared conductive trace forming at least a portion of the qubit body loop and at least a portion of the coupler body loop; a first set of vias electrically coupling the first wiring layer to the kinetic inductance layer; and a second set of vias electrically coupling the kinetic inductance layer to the second wiring layer, wherein the first set of vias and the second set of vias are each superconductive in a range of temperatures below a respective critical temperature.

The kinetic inductance later of the superconducting integrated circuit may comprise at least one of: TIN, NbN, NbTIN, WSi, and oxidized granular Al. The shared conductive trace may galvanically couple the qubit body loop to the coupler body loop.

A superconducting integrated circuit can be summarized as comprising: a non-compact qubit including a non-compact qubit body loop, the non-compact qubit body loop including a number of non-compact qubit inductances; a first number of control devices, each one of the first number of control devices communicatively coupled to the non-compact qubit body loop by a respective one of the number of non-compact qubit inductances; a compact kinetic inductance qubit including a compact qubit body loop, the compact qubit body loop comprising a kinetic inductance material, the compact qubit body loop including a number of compact qubit inductances; and a coupler having a coupler body loop, the coupler body loop including a number of coupling inductances, the coupler body loop communicatively coupled to the non-compact qubit body loop by one of the number of non-compact qubit inductances and one of the number of coupling inductances, and wherein the coupler body loop is communicatively coupled to the compact qubit body loop.

The kinetic inductance material may include a segment of kinetic inductance material. The coupler body loop may, for example, be galvanically communicatively coupled to the compact qubit body loop by the segment of kinetic inductance material. The kinetic inductance material may comprises at least one of: TIN, NbN, NbTIN, WSi, and oxidized granular Al. The coupler body loop may, for example, be magnetically communicatively coupled to the compact qubit body loop by at least one of the number of compact qubit inductances and one of the number of coupling inductances. The number of compact body inductances is less than the number of non-compact qubit inductances. The compact qubit body loop may occupy a first circuit area and the non-compact qubit body loop may occupy a second circuit area larger than the first circuit area. The superconducting integrated circuit may further comprise a second number of control devices communicatively coupled to the compact kinetic inductance qubit, wherein the second number of control devices less than the first number of control devices. The first number of control devices and the second number of control devices may include at least one of: a digital-to-analog converter, a control line, an address line, and a trigger line.

A superconducting integrated circuit may be summarized as comprising: a Josephson junction trilayer including an electrically insulative layer interposed between a pair of metal electrodes, the pair of metal electrodes comprising a material that is superconductive in a range of temperatures below a respective critical temperature; a kinetic inductance layer including a conductive trace, the conductive trace forming at least a portion of a compact qubit body loop; a first set of vias electrically coupling the Josephson junction trilayer to the kinetic inductance layer, the first set of vias comprising a material that is superconductive in a range of temperatures below a respective critical temperature; a first wiring layer including at least a portion of a coupler body loop, the first wiring layer comprising a material that is superconductive in a range of temperatures below a respective critical temperature; and a second set of vias electrically coupling the kinetic inductance layer to the first wiring layer, the second set of vias comprising a material that is superconductive in a range of temperatures below a respective critical temperature.

The compact qubit body loop and the coupler body loop may, for example, be galvanically coupled by the conductive trace of the kinetic inductance layer. The kinetic inductance layer may comprise at least one of: TIN, NbN, NbTIN, WSi, and oxidized granular Al. The superconducting integrated circuit may further comprise a second wiring layer including at least a portion of a non-compact qubit body loop, the second wiring layer superconductive in a range of temperatures below a respective critical temperature. The compact qubit body loop may occupy a first circuit area and the non-compact qubit body loop may occupy a second circuit area larger than the first circuit area.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

DETAILED DESCRIPTION

Figure 1A:
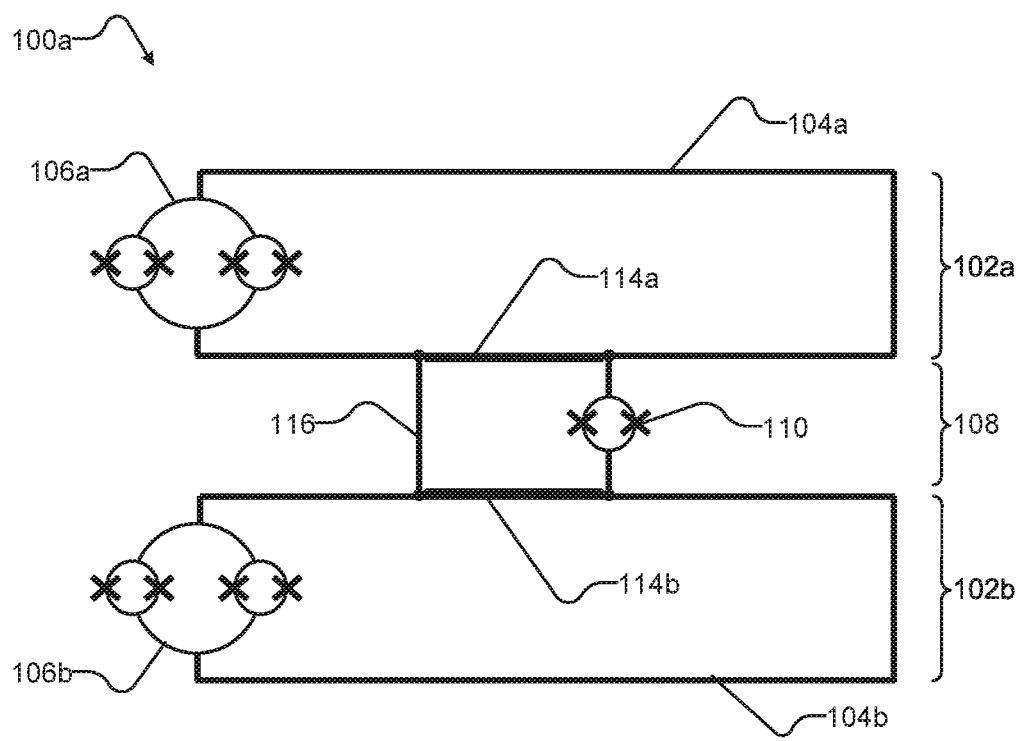
FIG. 1A is a schematic diagram illustrating an example implementation of a portion of a superconducting circuit with a galvanic kinetic inductance coupler, in accordance with the present systems, devices, articles, and methods.

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

It is generally desirable for superconducting devices of a quantum processor to be sufficiently isolated from the external environment to operate efficiently. For example, qubits are that are sufficiently shielded and isolated from noise may be better at maintaining quantum state information. However, it is also desirable for qubits to be sufficiently coupled to control devices, such as room temperature electronics, to allow for qubit manipulation and inter-qubit interactions. Other desirable features of qubits include parametric reproducibility and minimal circuit area footprint. Additionally, there exists a need for qubits that can maintain a coherent quantum state and have low parasitic impedance.

Kinetic inductance is one approach to realizing qubits that have the aforementioned features. Josephson inductance is a kinetic inductance that is made possible through Josephson Junctions. Qubits and other superconducting devices having Josephson Junctions can achieve quantum effects through quantized electrical properties arising from the Josephson effect. However, Josephson junctions can be sensitive to local heating during fabrication and typically require precise dielectric layer thicknesses. Both issues can be difficult to address using existing integrated circuit fabrication techniques. The present systems, devices, and methods describe superconducting devices that implement a kinetic inductance layer that can at least partially address these issues while achieving device reproducibility and compactness.

Galvanic Kinetic Inductance Coupling

Galvanic coupling can be achieved by merging two current paths, e.g., by sharing a length of wire in two sub-circuits. Galvanic coupling can be used as technique to reduce the size of superconducting devices in a superconducting integrated circuit. A benefit of smaller superconducting qubits can be a boosted energy scale resulting from an increase in a persistent current. A persistent current in a superconducting material is a flow of charge without resistance. Examples of a superconducting integrated circuit including galvanic coupling are described in U.S. Patent Application No. 62/693,305. One approach to reducing the size of superconducting devices is galvanic coupling by a kinetic inductance material. A kinetic inductance material stores energy in the kinetic energy of charge carriers within the body of a superconductor, rather than storing energy in a magnetic field like traditional magnetic inductors. In comparison to Josephson junctions, the onset of nonlinear inductance for a thin film comprising a kinetic inductance material can occur at greater stored energies. A kinetic inductance material has a high normal-state (i.e., non-superconducting state) resistivity which can result in a penetration depth on the order of several hundred nanometers. In a normal (non-superconducting) metal, the kinetic inductance of such a material can be negligible. A large surface impedance or sheet inductance can thus be achieved by a kinetic inductance material in a superconducting state. A kinetic inductance material typically exhibits more kinetic inductance than magnetic inductance, particularly for thin-films. Relative to inductive coupling by magnetic inductors, galvanic kinetic inductors are insensitive to dielectric thickness variations and depend mostly on properties of the superconducting material. Thus, galvanic kinetic inductance coupling is an attractive approach to achieving devices that are easily reproducible and compact.

FIG. 1A is schematic diagram illustrating an example implementation of a portion of a superconducting circuit 100 with a galvanic kinetic inductance coupler, in accordance with the present systems, devices, articles, and methods.

Circuit 100 includes a first superconducting qubit 102$a$ and a second superconducting qubit 102$b$ (collectively and individually 102). Superconducting qubits 102 each have a respective body loop 104$a$, 104$b$ and a respective compound-compound Josephson junction (CCJJ) 106$a$, 106$b$. In some implementations, superconducting qubits 102 can include a compound Josephson junction (CJJ). Superconducting qubits 102 can comprise a material that is superconductive in a range of temperatures below a respective critical temperature. For example, superconducting qubits 102 can comprise niobium, aluminum, or a combination thereof. In at least one implementation, superconducting qubits 102 can be superconducting flux qubits.

Circuit 100 includes a first segment of kinetic inductance material 114$a$ and a second segment of kinetic inductance material 114$b$. First segment of kinetic inductance material 114$a$ is interposed in body loop 104$a$ of first superconducting qubit 102$a$. Second segment of kinetic inductance material 114$b$ is interposed in body loop 104$b$ of second superconducting qubit 104$b$. Segments of kinetic inductance material 114$a$, 114$b$ (collectively 114) are illustrated with bolded lines in FIG. 1A. Segments of kinetic inductance material 114 can comprise a material exhibiting more kinetic inductance than magnetic inductance. In some implementations, segments of kinetic inductance material 114 can comprise TiN, NbN, NbTiN, WSi, oxidized granular Al, or a combination thereof.

A coupler 108 galvanically couples to first superconducting qubit 102$a$ and to second superconducting qubit 102$b$ by segments of kinetic inductance material 114. First superconducting qubit 102$a$ is communicatively coupled to second superconducting qubit 102$b$ via coupler 108. Coupler 108 includes a coupler body loop 116 and a CJJ 110. Coupler body loop 116 shares segments of kinetic inductance material 114 with superconducting qubits 102. Coupler 108 comprises a material that is superconductive in a range of temperatures below a respective critical temperature. For example, coupler 108 can comprise niobium, aluminum, or a combination thereof.

Figure 4:
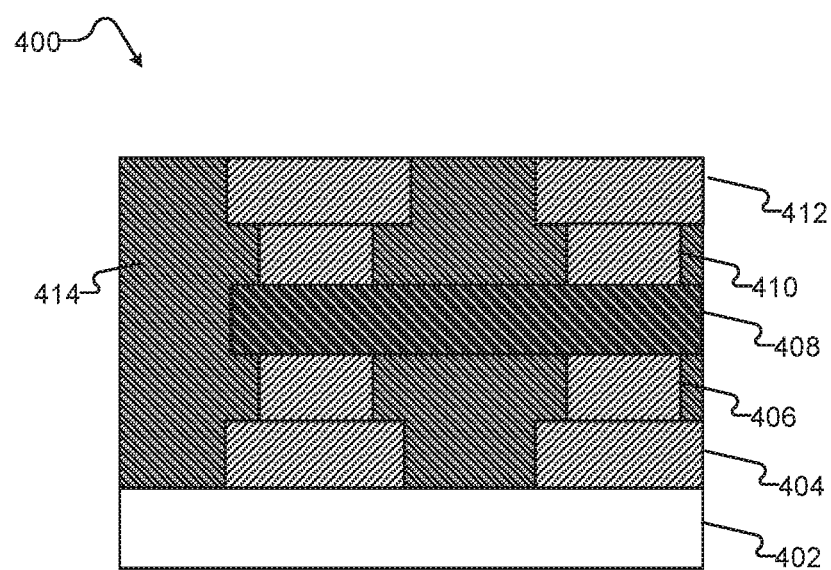
FIG. 4 is a sectional view of a portion of a multilayer integrated circuit including a galvanic kinetic inductance coupling, in accordance with the present systems, devices, and methods.

In some implementations, at least a portion of body loops 104 of superconducting qubits 102 and coupler body loop 116 can exist in or as a first layer of a multilayer integrated circuit and segments of kinetic inductance material 114 can exist in or as a second layer of the multilayer integrated circuit, with one or more vias coupling the portions of the segments of kinetic inductance material 114 with the portions of body loops 104 of superconducting qubits 102 and coupler body loop 116. An example of segments of kinetic inductance material 114 that are used for galvanic coupling are illustrated in FIG. 4.

In at least one implementation, a coupler provides communicative coupling between two qubits. The coupler can have multiple windings. In at least one implementation, the coupler is double-wound. In the present systems, devices, and methods, a double-wound coupler refers to a coupler in a multi-layer integrated circuit in which a coupler loop includes two segments, each segment in a different layer of the integrated circuit-one segment in a layer above a layer including a qubit loop, and the other segment below the layer including the qubit loop. In some implementations, a coupler can be triple-wound. A triple-wound coupler can include segments in three different layers of the integrated circuit.

Figure 1B:
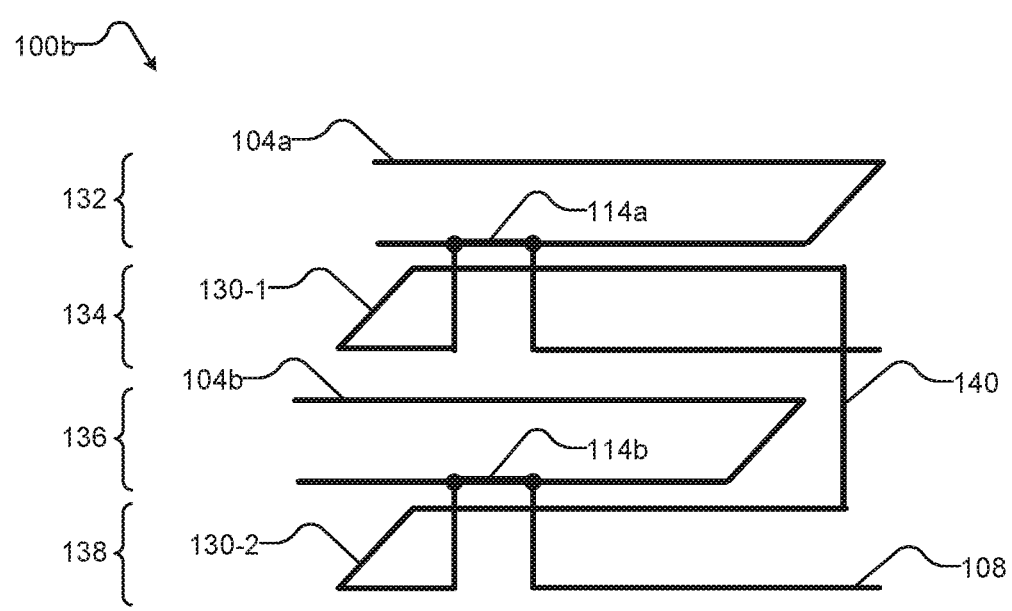
FIG. 1B is an isometric view schematically illustrating a portion of a multi-layer integrated circuit including a galvanic double-wound coupler, according to the present systems, devices, and methods.

FIG. 1B is an isometric view schematically illustrating a portion of a multi-layer integrated circuit 100$b$ including a galvanic double-wound coupler 108, according to the present systems, devices, and methods.

Galvanic double-wound coupler 108 includes two windings 130-1 and 130-2. Circuit 100$b$ includes four layers—an upper layer 132, a first intervening layer 134, a second intervening layer 136, and a lower layer 138. Galvanic double-wound coupler 108 includes a first segment of kinetic inductance material 114$a$ in upper layer 132 and a second segment of kinetic inductance material 114$b$ (collectively 114) in second intervening layer 136. Segments of kinetic inductance material 114 can comprise TiN, NbN, NbTiN, WSi, oxidized granular Al, or a combination thereof.

Galvanic double-wound coupler 108 is galvanically coupled to a body loop 104$a$ of a first superconducting qubit in upper layer 132 by first segment of kinetic inductance material 114$a$. Galvanic double-wound coupler 108 is further coupled to a body loop 104$b$ of a second superconducting qubit in second intervening layer 136 by second segment of kinetic inductance material 114$b$. Winding 130-1 is electrically coupled to winding 130-2 by an interconnect 140.

In some cases, it can be advantageous for a circuit to include both galvanic and magnetic couplings. For example, a symmetric coupler design can include a galvanic kinetic inductance coupling and a magnetic (i.e., inductive) coupling to each of a pair of qubits. Such coupler designs can be useful for avoiding the presence of circulating currents in closed loops of fully galvanic couplers.

Figure 2A:
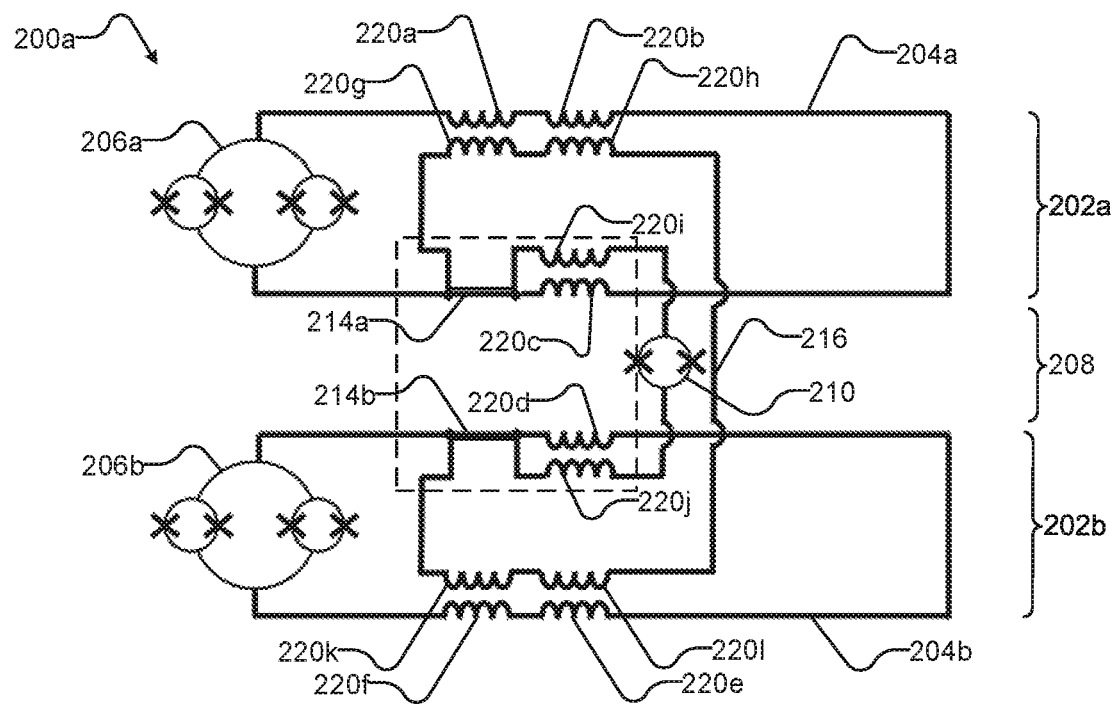
FIG. 2A is illustrating an example implementation of a portion of a superconducting circuit including a partially-galvanic coupler, in accordance with the present systems, devices, and methods.

FIG. 2A is a schematic diagram illustrating an example implementation of a portion of a superconducting circuit 200$a$ including a partially-galvanic coupler, in accordance with the present systems, devices, and methods.

Circuit 200$a$ includes a first superconducting qubit 202$a$ and a second superconducting qubit 202$b$ (collectively and individually 202). Superconducting qubits 202 each have a respective qubit body loop 204$a$, 204$b$ and a respective CCJJ 206$a$, 206$b$. In some implementations, superconducting qubits 202 can include a CJJ. Superconducting qubits 202 can comprise a material that is superconductive in a range of temperatures below a respective critical temperature (e.g., niobium, aluminum, or a combination thereof).

Circuit 200a includes a first segment of kinetic inductance material 214a and a second segment of kinetic inductance material 214b. First qubit body loop 204a includes three respective inductances 220a, 220b, 220c (collectively and individually 220). Second qubit body loop 204b includes three respective inductances 220d, 220e, 220f (collectively and individually 220). First segment of kinetic inductance material 214a is interposed in first qubit body loop 204a. Second segment of kinetic inductance material 214b is interposed in second qubit body loop 204b. Segments of kinetic inductance material 214a, 214b (collectively 214) are illustrated with bolded lines in FIG. 2A. Segments of kinetic inductance material 214 can comprise a material exhibiting more kinetic inductance than magnetic inductance. In some implementations, segments of kinetic inductance material 214 can comprise TIN, NbN, NbTIN, WSi, oxidized granular Al, or a combination thereof.

A CJJ partially-galvanic coupler 208 includes a coupler body loop 216 that is interrupted by a CJJ 210 and by segments of kinetic inductance material 214. Partially-galvanic coupler 208 is galvanically and magnetically coupled to superconducting qubits 202. Coupler body loop 216 of partially-galvanic coupler 208 shares segments of kinetic inductance material 214 with qubit body loops 204. Coupler body loop 216 is galvanically coupled to first qubit body loop 204a by first segment of kinetic inductance material 214a. Coupler body loop 216 is galvanically coupled to second qubit body loop 204b by second segment of kinetic inductance material 214b.

Coupler body loop 216 includes six inductances 220g, 220h, 220i, 220j, 220k, 220l (collectively and individually 220). Partially-galvanic coupler 208 is magnetically communicatively coupled to first superconducting qubit 202a by coupling of inductances 220a, 220b, 220c of first qubit body loop 204a and inductances 220g, 220h, 220i of coupler body loop 216. Partially-galvanic coupler 208 is magnetically communicatively coupled to second superconducting qubit 202b by coupling of inductances 220d, 220e, 220f of second qubit body loop 204b and inductances 220j, 220k, 220l of coupler body loop 216.

In some implementations, qubit body loops have a different number of inductances than the number of inductances illustrated in FIG. 2A. In some implementations, more than one segment of kinetic inductance material can be interposed in qubit body loops and/or coupler body loops.

A portion of circuit 200a can be implemented including a partially-galvanic coupler that has multiple windings. A galvanic coupling and a magnetic coupling to a superconducting qubit can each be in a different layer of a multi-layer integrated circuit.

Figure 2B:
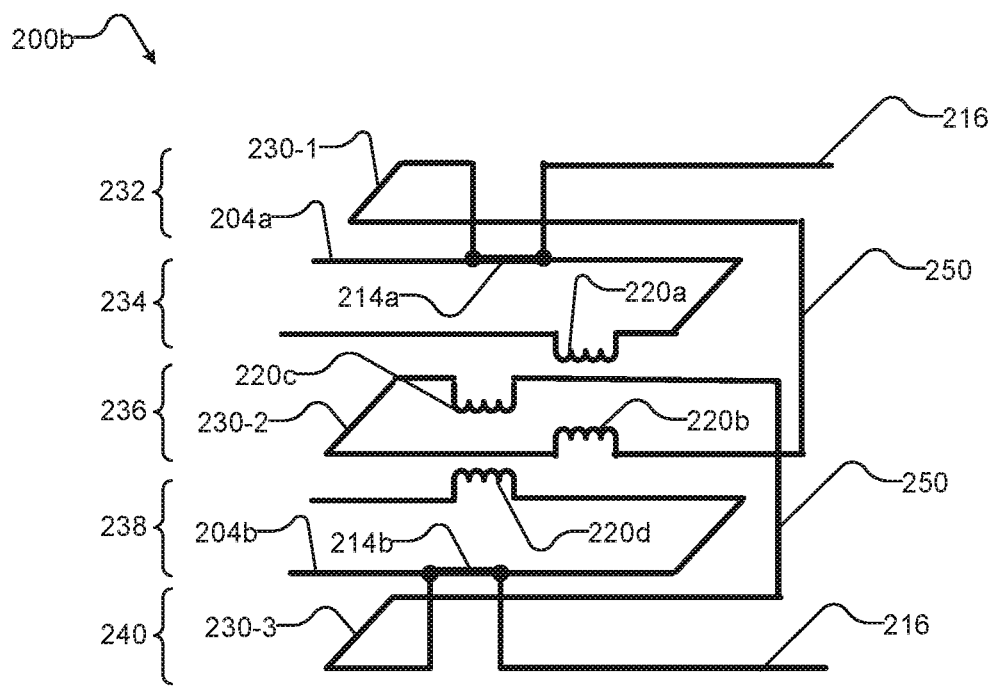
FIG. 2B is an isometric view schematically illustrating a portion of a multi-layer integrated circuit including a partially-galvanic triple-wound coupler, according to the present systems, devices, and methods.

FIG. 2B is an isometric view schematically illustrating a portion of a multi-layer integrated circuit 200b including a partially-galvanic triple-wound coupler, according to the present systems, devices, and methods. Circuit 200b is an implementation of a portion of circuit 200a outlined by a dash-lined box in FIG. 2A.

Partially-galvanic triple-wound coupler has a coupler body loop 216 including three windings 230-1, 230-2, 230-3. Circuit 200b includes five layers—an upper layer 232, a first intervening layer 234, a second intervening layer 236, a third intervening layer 238, and a lower layer 240. Coupler body loop 216 includes a first segment of kinetic inductance material 214a in first intervening layer 234 and a second segment of kinetic inductance material 214b (collectively 114) in third intervening layer 238.

Coupler body loop 216 of the partially-galvanic triple-wound coupler is galvanically coupled to first qubit body loop 204a of a first superconducting qubit in first intervening layer 234 by first segment of kinetic inductance material 214a. Body loop 216 is also galvanically coupled to a second body loop 204b of a second superconducting qubit in third intervening layer 238 by second segment of kinetic inductance material 214b. Segments of kinetic inductance material 214 can comprise TIN, NbN, NbTIN, WSi, oxidized granular Al, or a combination thereof.

First qubit loop 204a includes a first inductance 220a in first intervening layer 234. Coupler body loop 216 includes two inductances 220b, 220c in second intervening layer 236. Second qubit loop 204b includes a fourth inductance 220d in third intervening layer 238. The first superconducting qubit is magnetically communicatively coupled to the partially-galvanic triple-wound coupler by coupling of inductance 220a of first qubit loop 204a and inductance 220b of coupler body loop 216. The second superconducting qubit is magnetically communicatively coupled to the partially-galvanic triple-wound coupler by coupling of inductance 220d of second qubit loop 204b and inductance 220c of coupler body loop 216. Windings 230-1, 230-2, 230-3 are electrically coupled to one another by interconnects 250. In some implementations, body loop 216 may be included in a double wound coupler. In some implementations, circuit 200b may have more or less than five layers. Galvanic couplings and/or magnetic couplings may be included in different layers than those illustrated in FIG. 2B.

Throughout the present specification, the phrases "asymmetric coupler" and "asymmetric coupling" are used to describe a coupler design in which the coupler has a different type of coupling to a first qubit than to a second qubit. From a circuit layout perspective, a coupling of an asymmetric coupler to a first qubit can be different from a coupling of the asymmetric coupler to a second qubit. For example, an asymmetric coupler can be galvanically coupled to a first qubit and magnetically coupled to a second qubit. Note that the phrases "asymmetric coupler" and "asymmetric coupling" do not necessarily suggest that an inductance (sometimes referred to as a mutual inductance) realized by an asymmetric coupler coupling to a first qubit is different than an inductance realized by the coupler coupling to a second qubit. For instance, an inductance realized by a galvanically coupling of an asymmetric coupler to a first qubit can be the same as an inductance realized by a magnetically coupling of the asymmetric coupler to a second qubit.

In some cases, it can be advantageous for a circuit to include an asymmetric coupler having both galvanic and magnetic couplings. For example, an asymmetric coupler design can include a galvanic kinetic inductance coupling to a first qubit and a magnetic (i.e., inductive) coupling to a second qubit. Such coupler designs can be useful for avoiding the presence of circulating currents in closed loops of fully galvanic couplers. The galvanic kinetic inductance coupling to the first qubit can be stronger than the magnetic coupling to the second qubit. The stronger galvanic kinetic inductance coupling can be realized by a double winding of the asymmetric coupler and the weaker magnetic coupling can be realized with a single winding of the asymmetric coupler.

Figure 3A:
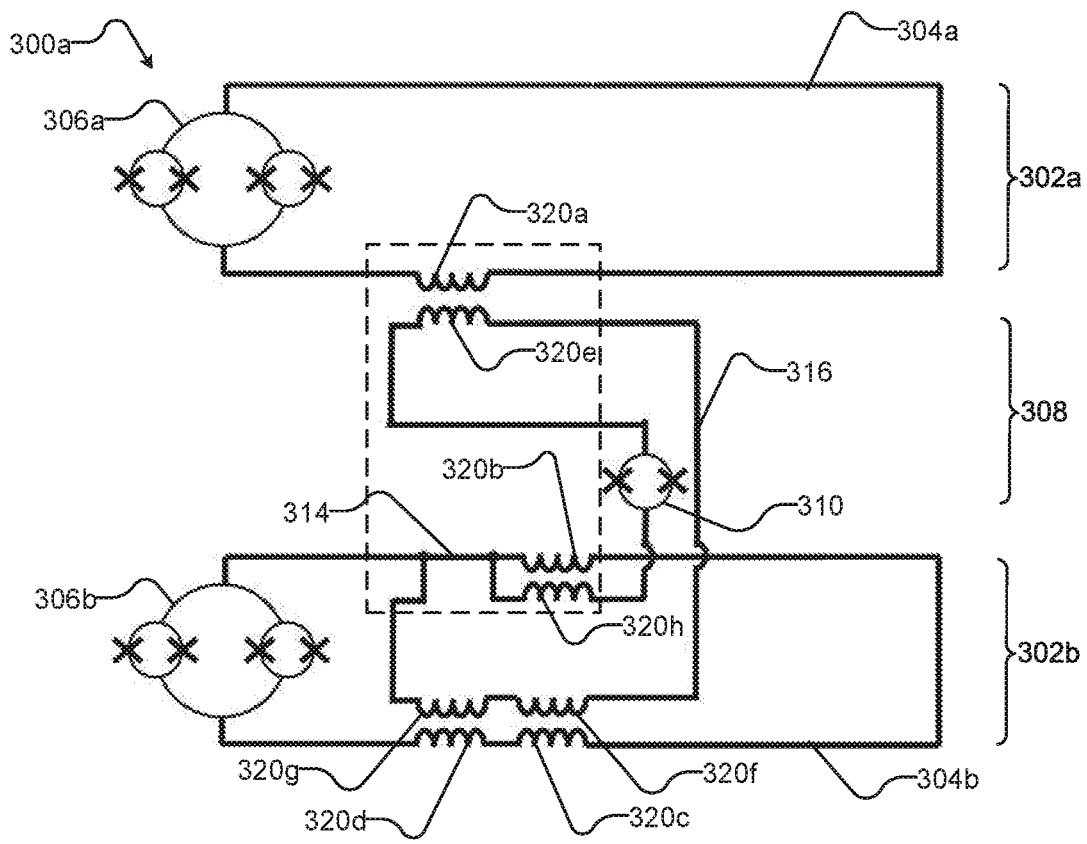
FIG. 3A is a schematic diagram illustrating an example implementation of a portion of a superconducting circuit including an asymmetric partially-galvanic coupler, in accordance with the present systems, devices, and methods.

FIG. 3A is a schematic diagram illustrating an example implementation of a portion of a superconducting circuit 300a including an asymmetric partially-galvanic coupler, in accordance with the present systems, devices, and methods.

Circuit 300a includes a first superconducting qubit 302a and a second superconducting qubit 302b (collectively and individually 302). Superconducting qubits 302 each have a respective qubit body loop 304a, 304b and a respective CCJJ 306a, 306b. In some implementations, superconducting qubits 302 can include a CJJ. Superconducting qubits 302 can comprise a material that is superconductive in a range of temperatures below a respective critical temperature (e.g., niobium, aluminum, or a combination thereof).

First qubit body loop 304a includes a first inductance 320a. Second qubit body loop 204b includes three respective inductances 320b, 320c, 320d (collectively and individually 320). A segment of kinetic inductance material 314 can be interposed in second qubit body loop 304b. Segment of kinetic inductance material 314 is illustrated with a bolded line in FIG. 2A. Segment of kinetic inductance material 314 can comprise a material exhibiting more kinetic inductance than magnetic inductance. In some implementations, segment of kinetic inductance material 314 can comprise TiN, NbN, NbTIN, WSi, oxidized granular Al, or a combination thereof.

An asymmetric partially-galvanic coupler 308 includes a coupler body loop 316 that is interrupted by a CJJ 310. Coupler body loop 316 includes segment of kinetic inductance material 314. Asymmetric partially-galvanic coupler 308 is magnetically coupled to first superconducting qubit 302a. Asymmetric partially-galvanic coupler 308 is galvanically and magnetically coupled to second superconducting qubit 302b. Coupler body loop 316 of asymmetric partially-galvanic coupler 308 shares segment of kinetic inductance material 314 with second qubit body loop 304b of second superconducting qubit 302b. Coupler body loop 308 is galvanically coupled to second qubit body loop 304a by segment of kinetic inductance material 314.

Coupler body loop 316 includes four inductances 320e, 320f, 320g, 320h (collectively and individually 320). Asymmetric partially-galvanic coupler 308 is magnetically communicatively coupled to first superconducting qubit 302a by coupling of inductances 320a of first qubit body loop 304a and inductance 320e of coupler body loop 316. Asymmetric partially-galvanic coupler 308 is magnetically communicatively coupled to second superconducting qubit 302b by coupling of inductances 320b, 320c, 320d of second qubit body loop 304b and inductances 320f, 320g, 320h of coupler body loop 316. In some implementations, coupler body loop 316 may implement: a magnetic coupling to first qubit body loop 304a by a coupling of inductance 320e of coupler 308 and inductance 320a of first superconducting qubit 302a, and a galvanic coupling to second qubit body loop 304b by segment of kinetic inductance material 314 (i.e., inductances 320b, 320c, 320d, 320f, 320g, 320h may be optional).

In some implementations, qubit body loops have a different number of inductances than the number of inductances illustrated in FIG. 3A. In some implementations, more than one segment of kinetic inductance material can be interposed in qubit body loops and/or coupler body loops. In some implementations, the galvanic coupling of asymmetric partially-galvanic coupler to the second qubit is stronger than the magnetic coupling of asymmetric partially-galvanic coupler to the first qubit. For example, a mutual inductance achieved by the galvanic coupling of the asymmetric partially-galvanic coupler to the second qubit can be stronger than a mutual inductance achieved by the magnetic coupling of the asymmetric partially-galvanic coupler to the first qubit.

A portion of circuit 300a can be implemented including an asymmetric partially-galvanic coupler that has multiple windings. A magnetic coupling of the asymmetric partially-galvanic coupler to a first superconducting qubit can be realized by a single winding. A galvanic coupling and a magnetic coupling of the asymmetric partially-galvanic coupler to a second superconducting qubit can be realized by a double winding. Each winding can be in a different layer of a multi-layer integrated circuit.

Figure 3B:
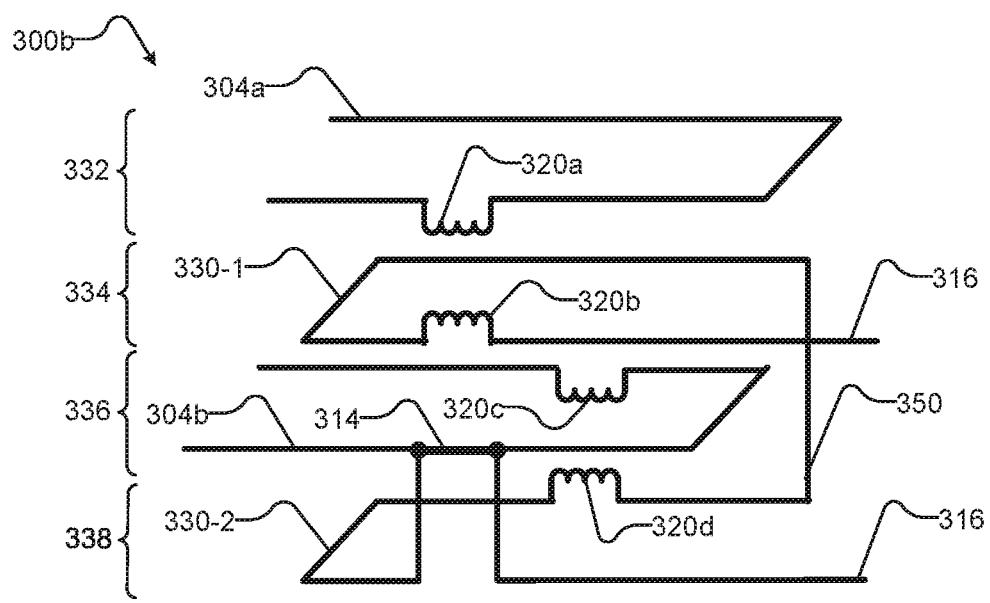
FIG. 3B is an isometric view schematically illustrating a portion of a multi-layer integrated circuit including an asymmetric partially-galvanic double-wound coupler, according to the present systems, devices, and methods.

FIG. 3B is an isometric view schematically illustrating a portion of a multi-layer integrated circuit 300b including an asymmetric partially-galvanic double-wound coupler, according to the present systems, devices, and methods. Circuit 300b is an implementation of a portion of circuit 300a outlined by a dash-lined box in FIG. 3A.

Asymmetric partially-galvanic double-wound coupler has a coupler body loop 316 including two windings 330-1, 330-2. Circuit 300b includes four layers—an upper layer 332, a first intervening layer 334, a second intervening layer 336, and a lower layer 338. Coupler body loop 316 includes a segment of kinetic inductance material 314 in second intervening layer 336. Segment of kinetic inductance material 314 can comprise TIN, NbN, NbTIN, WSi, oxidized granular Al, or a combination thereof.

Coupler body loop 316 of the asymmetric partially-galvanic double-wound coupler is galvanically coupled to second qubit body loop 304b of a second superconducting qubit in second intervening layer 336 by segment of kinetic inductance material 314.

First qubit loop 304a includes a first inductance 320a in upper layer 332. Coupler body loop 316 includes a second inductance 320b in first intervening layer 334. Second qubit loop 304b includes a third inductance 320c in second intervening layer 336. Coupler body loop 316 includes a fourth inductance 320d in lower layer 338. The first superconducting qubit is magnetically communicatively coupled to the asymmetric partially-galvanic double-wound coupler by coupling of inductance 320a of first qubit loop 304a and inductance 320b of coupler body loop 316. The second superconducting qubit is magnetically communicatively coupled to the asymmetric partially-galvanic double-wound coupler by coupling of inductance 320c of second qubit loop 304b and inductance 320d of coupler body loop 316. Windings 330-1, 330-2 are electrically coupled to one another by interconnect 350.

A superconducting device can include a superconducting trace that is continuous in more than one layer of a multi-layer integrated circuit. The multilayer integrated circuit can include a set of wiring layers, a set of dielectric layers, and a set of kinetic inductance layers. For example, a superconducting qubit can have a first portion of a body loop that exists in or on a first wiring layer and a second portion of the body loop that exists in or on a kinetic inductance layer. The second portion of the body loop can be a galvanic connection to a portion of another superconducting device, such as a coupler.

FIG. 4 is a sectional view of a portion of a multilayer integrated circuit 400 including a galvanic kinetic inductance coupling, in accordance with the present systems, devices, and methods. Integrated circuit 400 is an implementation of a circuit comprising a galvanic connection by a kinetic inductance material (e.g., segments 114 of circuit 100a in FIG. 1A, segments 114 of circuit 100b in FIG. 1B, segments 214 of circuit 200a in FIG. 2A, segments 214 of circuit 200b in FIG. 2B, segment 314 of circuit 300a in FIG. 3A, and segment 314 of circuit 300b in FIG. 3B).

Integrated circuit 400 includes a substrate 402 carrying a first wiring layer 404. First wiring layer 404 can comprise a material that is superconductive in a range of temperatures below a respective critical temperature. In some implementations, first wiring layer 404 can comprise niobium, aluminum, or a combination thereof. First wiring layer 404 can include at least a portion of a first superconducting device galvanically coupled to a second superconducting device. In at least one implementation, first wiring layer can include at least a portion of a qubit galvanically coupled to a coupler. For example, first wiring layer can include a portion of a qubit body loop of a qubit galvanically coupled to a coupler.

Integrated circuit 400 includes a first set of vias 406 electrically coupling a kinetic inductance layer 408 to first wiring layer 404. Kinetic inductance layer 408 can include a shared conductive trace forming at least a portion of the first superconducting device and at least a portion of the second superconducting device. The shared conductive trace can be a galvanic coupling portion that galvanically coupled the first superconducting device to the second superconducting device. Kinetic inductance layer 408 can include a portion of the first superconducting device and a portion of the second superconducting device. For example, kinetic inductance layer 408 can include a portion of a qubit body loop and a portion of a coupler body loop. Kinetic inductance layer 408 can include a segment galvanically coupling the first superconducting device to the second superconducting device. For example, kinetic inductance layer 408 can include segments of kinetic inductance material 114 of circuit 100a in FIG. 1A. Kinetic inductance layer 408 can comprise a material exhibiting more kinetic inductance than magnetic inductance. In some implementations, kinetic inductance layer 408 can comprise TiN, NbN, NbTiN, WSi, oxidized granular Al, or a combination thereof. First set of vias 406 can comprise a material that is superconducting in a respective range of temperatures (e.g., niobium, aluminum, or a combination thereof).

Integrated circuit 400 includes a second set of vias 410 electrically coupling kinetic inductance layer 408 to a second wiring layer 412. Second wiring layer 412 can comprise a material that is superconductive in a range of temperatures below a respective critical temperature. In some implementations, second wiring layer 412 can comprise niobium, aluminum, or a combination thereof. Second wiring layer 412 can include at least a portion of a second superconducting device galvanically coupled to a first superconducting device. In at least one implementation, second wiring layer 412 can include at least a portion of a coupler galvanically coupled to a qubit. For example, second wiring layer 412 can include a portion of a coupler body loop of a coupler galvanically coupled to a qubit.

Integrated circuit 400 includes a dielectric 414 overlying at least a portion of each element of circuit 400. For example, dielectric 414 overlies at least a portion of first wiring layer 404. In some implementations, dielectric 414 comprises a plurality of dielectric layers. Each of the plurality of dielectric layers can be deposited at a different stage of fabrication of integrated circuit 400. Superconducting integrated circuit fabrication methods are described in U.S. Pat. No. 9,978,809. In some implementations, dielectric 414 can comprise silicon dioxide, silicon nitride, or a combination thereof.

In some cases, it can be advantageous for a superconducting qubit to have a compact body loop comprising kinetic inductance material. A compact kinetic inductance qubit comprises a kinetic inductance material in the body loop and occupies a smaller circuit area than a typical superconducting qubit (i.e., a qubit having a non-compact qubit body loop and without kinetic inductance material). A compact kinetic inductance qubit can achieve an inductance that is comparable to the magnetic inductance of a typical superconducting qubit. Compact kinetic inductance qubits can have less parasitic capacitance relative to typical superconducting qubits. Compact kinetic inductance qubits can realize a certain self-inductance and coupling inductance while occupying a smaller circuit area. An example of an application in which compact kinetic inductance qubits are useful is in circuit designs having a reduced control circuitry area. In particular, compact kinetic inductance qubits can be beneficial in applications that utilize ancilla qubits. For example, compact kinetic inductance qubits can be useful for error correction. Such circuits can employ a compact kinetic inductance qubit as ancilla qubit. An ancilla qubit can be locally coupled to less qubits compared to a typical superconducting qubit (i.e., a non-compact qubit). Ancilla qubits may utilize less extensive control circuitry than typical superconducting qubits, and hence can be made compact.

Figure 5:
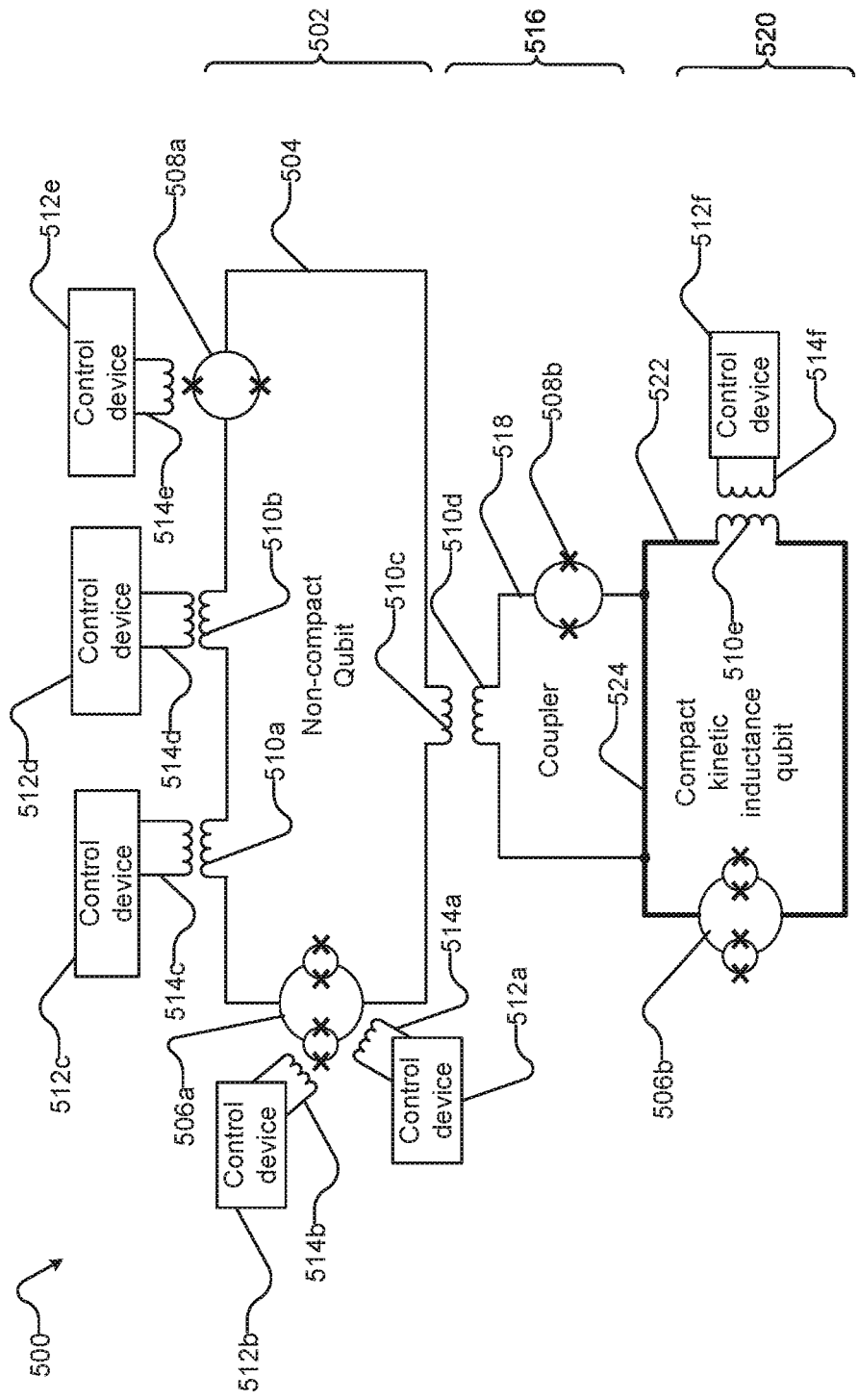
FIG. 5 is a schematic diagram illustrating a circuit including a compact kinetic inductance qubit, in accordance with the present systems, devices, and methods.

FIG. 5 is a schematic diagram illustrating a circuit 500 including a compact kinetic inductance qubit, in accordance with the present systems, devices, and methods.

Circuit 500a includes a non-compact qubit 502 coupled to a compact kinetic inductance qubit 522 by a coupler 516. Non-compact qubit 502 can be a superconducting flux qubit comprising a material that is superconductive in a range of temperatures below a respective critical temperature (e.g., niobium, aluminum, or a combination thereof). Non-compact qubit 502 includes a non-compact qubit body loop 504 that is interrupted by a CCJJ 506a and a CJJ 508a. Non-compact qubit 502 has three inductances 510a, 510b, 510c (collectively and individually 510). Inductances 510a, 510b, and 510c can be non-compact qubit inductances.

Circuit 500a includes a set of control devices 512a, 512b, 512c, 512d, 512e (collectively and individually 512) that each comprise a respective inductance 514a, 514b, 514c, 514d, 514e (collectively and individually 514). In at least one implementation, the set of control devices 512 can include a digital-to-analog converter (DAC), a control line, or a combination thereof.

Non-compact qubit 502 is magnetically communicatively coupled to control devices 512a, 512b by a coupling of CCJJ 506a of non-compact qubit 502 to inductances 514a, 514b of control devices 512a, 512b. In at least one implementation, at least one of control devices 512a, 512b can be a minor lobe line. In at least one implementation, at least one of control devices 512a, 512b can be a control line for an addressing scheme (i.e., a trigger line or an address line). Non-compact qubit 502 is magnetically communicatively coupled to control devices 512c, 512d by coupling of inductances 510a, 510b of non-compact qubit body loop 504 to inductances 514c, 514d of control devices 512c, 512d. In at least one implementation, at least one of control devices 512c, 512d can be a persistent current compensator DAC. Non-compact qubit 502 is magnetically communicatively coupled to control device 512e by coupling of CJJ 508a of non-compact qubit 502 to inductance 514e of control device 512e. In at least one implementation, control device 512e can be an inductance-tuner DAC.

Coupler 516 includes a coupler body loop 518 interrupted by a CJJ 508b. Coupler 516 comprises a material that is superconductive in a range of temperatures below a respective critical temperature (e.g., niobium, aluminum, or a combination thereof). Coupler 516 includes an inductance 510d. Inductance 510d can be a coupling inductance. Coupler 516 is communicatively coupled to non-compact qubit 502. In some implementations, coupler 516 is magnetically communicatively coupled to non-compact qubit 502 by a coupling of inductance 510d of coupler body loop 518 and inductance 510c of non-compact qubit body loop 504. In some implementations, non-compact qubit body loop 504 of non-compact qubit 502 can be galvanically coupled to coupler body loop 518 of coupler 516.

Coupler 516 is communicatively coupled to compact qubit 520. Coupler 516 can include a segment of kinetic inductance material 524. Segment of kinetic inductance material can comprise a material exhibiting more kinetic inductance than magnetic inductance. In some implementations, segment of kinetic inductance material 524 can comprise TIN, NbN, NbTIN, WSi, oxidized granular Al, or a combination thereof. Coupler body loop 518 can be galvanically coupled to compact qubit body loop 522 by segment of kinetic inductance material 524. In some implementations, coupler body loop 518 can be magnetically communicatively coupled to compact qubit body loop 522 by a respective inductance. In some implementations, coupler 516 can include a respective set of inductances (not illustrated in FIG. 5).

Compact kinetic inductance qubit 520 includes a compact qubit body loop 522 interrupted by a CCJJ 506b. Compact kinetic inductance 520 qubit can comprise a kinetic inductance material, such as TIN, NbN, NbTIN, WSi, oxidized granular Al, or a combination thereof. At least a portion of compact qubit body loop 522 comprises a kinetic inductance material. In at least one implementation, compact qubit body loop 522 can include a segment of kinetic inductance material 524. In at least one implementation, an entirety of compact qubit body loop 522 comprises a kinetic inductance material (as illustrated by the bolded line in FIG. 5). Compact kinetic inductance qubit 520 can be galvanically coupled to coupler 516 by segment of kinetic inductance material 524. In at least one implementation, compact kinetic inductance qubit 520 can be magnetically coupled to coupler 516 (not illustrated). Compact qubit body loop 522 can occupy a smaller circuit area than non-compact qubit body loop 504.

Compact kinetic inductance qubit 520 can include a respective inductance 510e. Inductance 510e can be a compact qubit inductance. Compact kinetic inductance qubit 520 can be magnetically communicatively coupled to control device 512f by coupling of inductance 510e of compact qubit body loop 522 and inductance 514f of control device 512f. Compact kinetic inductance qubit 520 is communicatively coupled to less control devices 512 than non-compact qubit 502. In some implementations, compact kinetic inductance qubit 520 can be locally coupled to less qubits than non-compact qubit 502. In some implementations, compact kinetic inductance qubit 520 can be an ancilla qubit (i.e., a qubit that does not embed a problem submitted by a user).

Figure 6:
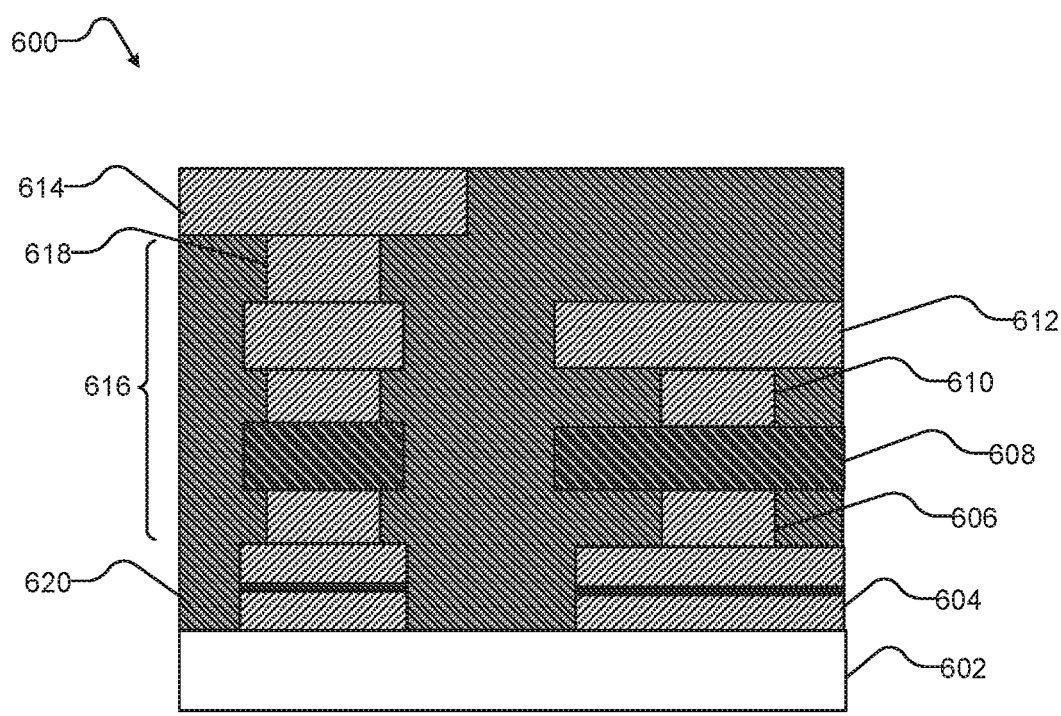
FIG. 6 is a sectional view of a portion of a multilayer integrated circuit including a compact kinetic inductance qubit body loop, in accordance with the present systems, devices, and methods.

FIG. 6 is a sectional view of a portion of a multilayer integrated circuit 600 including a compact kinetic inductance qubit body loop. Integrated circuit 600 is an implementation of a circuit comprising at least a portion of a compact qubit body loop formed from a kinetic inductance material (e.g., at least a portion of compact qubit body loop 522 of circuit 500 in FIG. 5).

Integrated circuit 600 includes a substrate 602 carrying a trilayer Josephson junction 604. Trilayer Josephson junction 604 can comprise two electrodes formed from a material that is superconductive in a range of temperatures below a respective critical temperature (e.g., aluminum). A thin insulative layer that can include an oxide is interposed between a pair of electrodes of trilayer Josephson junction 604. Trilayer Josephson junction 604 can be included in a superconducting device, such as a qubit.

Integrated circuit 600 includes a first set of vias 606 electrically coupling a kinetic inductance layer 608 to trilayer Josephson junction 604. Kinetic inductance layer 608 can comprise a material exhibiting more kinetic inductance than magnetic inductance. In some implementation, kinetic inductance layer 608 can comprise a kinetic inductance material, such as TIN, NbN, NbTIN, WSi, oxidized granular Al, or a combination thereof. Kinetic inductance layer 608 can include a conductive trace forming at least a portion of a compact qubit body loop of a compact kinetic inductance qubit. In at least one implementation, kinetic inductance layer 608 can include an entirety of a compact qubit body loop of a compact kinetic inductance qubit. For example, kinetic inductance layer 608 can include compact qubit body loop 522 of circuit 500 in FIG. 5. First set of vias 606 can comprise a material that is superconducting in a respective range of temperatures (e.g., niobium, aluminum, or a combination thereof).

Integrated circuit 600 includes a second set of vias 610 electrically coupling kinetic inductance layer 608 to a first wiring layer 612. First wiring layer 612 can comprise a material that is superconductive in a range of temperatures below a respective critical temperature. In some implementations, first wiring layer 612 can comprise niobium, aluminum, or a combination thereof. First wiring layer 612 can include at least a portion of a first superconducting device coupled to a second superconducting device. For example, first wiring layer 612 can include a coupler body loop of a coupler galvanically coupled to a compact kinetic inductance qubit. In at least one implementation, first wiring layer 612 can include a coupler body loop of a coupler magnetically communicatively coupled to a non-compact qubit. In some implementations, first wiring layer 612 can include at least a portion of a compact qubit body loop of a compact kinetic inductance qubit, the portion included in a different layer than kinetic inductance layer 608.

Integrated circuit 600 includes a second wiring layer 614. Second wiring layer 614 can comprise a material that is superconductive in a range of temperatures below a respective critical temperature. In some implementations, second wiring layer 614 can comprise niobium, aluminum, or a combination thereof. Second wiring layer 614 can include at least a portion of a third superconducting device magnetically communicatively coupled to a second superconducting device. In at least one implementation, second wiring layer 614 can include at least a portion of a non-compact qubit body loop of a non-compact qubit magnetically communicatively coupled to a coupler. In at least one implementation, second wiring layer 614 can include at least of a portion of a non-compact qubit body loop magnetically communicatively coupled to a compact qubit body loop via a coupler body loop. Second wiring layer 614 is electrically coupled to trilayer Josephson junction 604 by a via stack 616. Via stack 616 can include a respective portion of first set of vias 606, kinetic inductance layer 608, second set of vias 610, and first wiring layer 612. Via stack 616 can further include a third set of vias 618 comprising a material that is superconductive in a range of temperatures below a respective critical temperature (e.g., niobium, aluminum, or a combination thereof). Third set of vias 618 electrically couples second wiring layer 614 to first wiring layer 612. A compact qubit body loop included in kinetic inductance layer 608 can occupy a smaller circuit area (e.g., have a smaller footprint) than a non-compact qubit body loop included in second wiring layer 614.

Integrated circuit 600 includes a dielectric 620 overlying at least a portion of each element of circuit 600. For example, dielectric 620 overlies at least a portion of trilayer Josephson junction 604 and kinetic inductance layer 608. In some implementations, dielectric 620 comprises a plurality of dielectric layers. Each of the plurality of dielectric layers can be deposited at a different stage of fabrication of integrated circuit 600. In some implementations, dielectric 620 can comprise silicon dioxide, silicon nitride, or a combination thereof.

Figure 7:
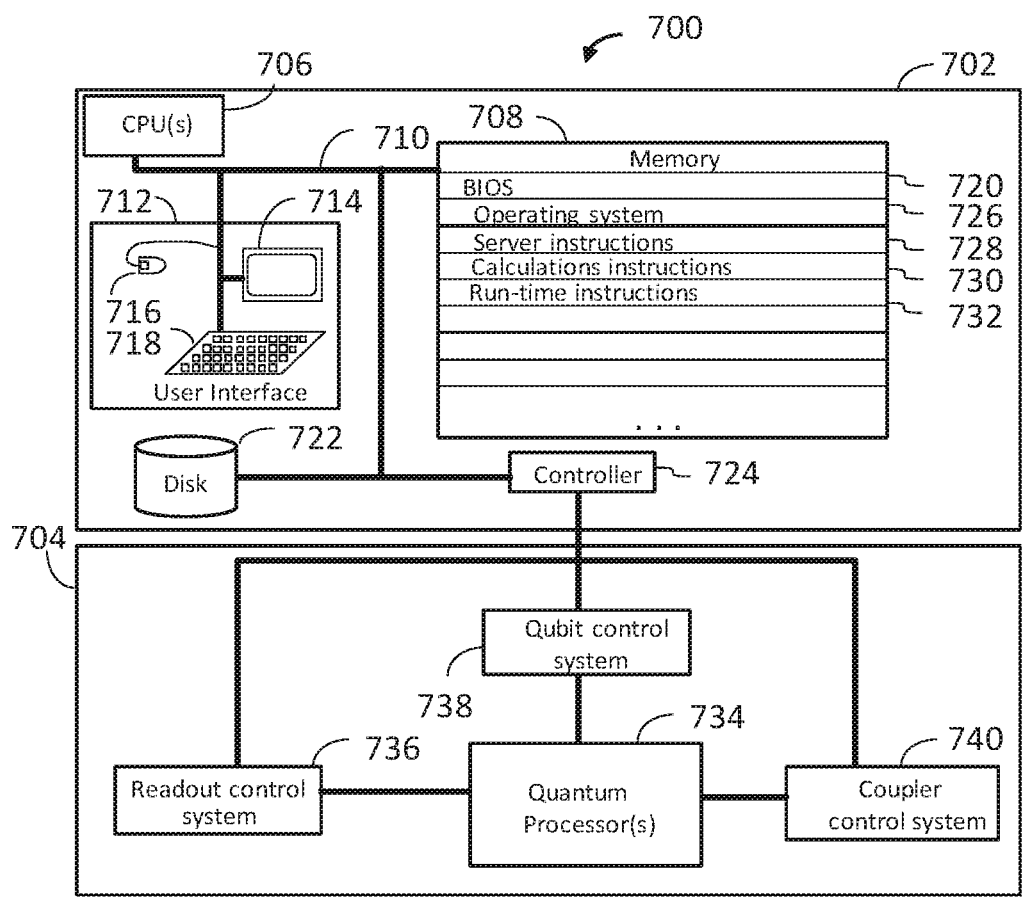
FIG. 7 illustrates a hybrid computing system including a digital computer coupled to an analog computer, in accordance with the present systems, devices, and methods.

FIG. 7 illustrates a hybrid computing system 700 including a digital computer 702 coupled to an analog computer 704. In some implementations, analog computer 704 is a quantum computer and digital computer 702 is a classical computer.

The exemplary digital computer 702 includes a digital processor (such as one or more central processor units 706) that may be used to perform classical digital processing tasks described in the present systems and methods. Those skilled in the relevant art will appreciate that the present systems and methods can be practiced with other digital computer configurations, including hand-held devices, multiprocessor systems, microprocessor-based or programmable consumer electronics, personal computers ("PCs"), network PCs, and the like, when properly configured or programmed to form special purpose machines, and/or when communicatively coupled to control an analog computer, for instance a quantum computer.

Digital computer 702 will at times be referred to in the singular herein, but this is not intended to limit the application to a single digital computer. The present systems and methods can also be practiced in distributed computing environments, where tasks or sets of instructions are performed or executed by remote processing devices, which are linked through a communications network. In a distributed computing environment computer-readable and/or processor-readable instructions (sometimes known as program modules), application programs and/or data, may be stored in local and/or remote memory storage devices.

Digital computer 702 may include at least one or more digital processors (e.g., one or more central processor units 706), one or more system memories 708, and one or more system buses 710 that couple various system components, including system memory 708 to central processor unit 706. The digital processor may be any logic processing unit, such as one or more central processing units ("CPUs") with one or more cores, graphics processing units ("GPUs"), digital signal processors ("DSPs"), application-specific integrated circuits ("ASICs"), field-programmable gate arrays ("FPGAs"), programmable logic controllers (PLCs), etc.

Digital computer 702 may include a user input/output subsystem 712. In some implementations, the user input/output subsystem includes one or more user input/output components such as a display 714, mouse 716, and/or keyboard 718. System bus 710 can employ any known bus structures or architectures, including a memory bus with a memory controller, a peripheral bus, and a local bus. System memory 708 may include non-volatile memory, for example one or more of read-only memory ("ROM"), static random-access memory ("SRAM"), Flash NAND; and volatile memory, for example random access memory ("RAM") (not shown), all of which are examples of non-transitory computer-readable and/or processor-readable media. A basic input/output system ("BIOS") 720, which can form part of the ROM, contains basic routines that help transfer information between elements within digital computer 702, such as during startup.

Digital computer 702 may also include other non-volatile memory 722. Non-volatile memory 722 may take a variety of forms, including: a hard disk drive, an optical disk drive, and/or a magnetic disk drive, all of which are examples of non-transitory computer- or processor-readable media. Non-volatile memory 722 may communicate with digital processor via system bus 710 and may include appropriate interfaces or controllers 724 coupled to system bus 710. Non-volatile memory 722 may serve as non-transitory long-term storage for computer-readable and/or processor-readable instructions, data structures, or other data (also called program modules) for digital computer 702.

Although digital computer 702 has been described as employing hard disks, optical disks and/or magnetic disks, those skilled in the relevant art will appreciate that other types of non-volatile computer-readable media may be employed, such flash memory cards, smart cards, etc., all of which are further examples of non-transitory computer- or processor-readable media. Those skilled in the relevant art will appreciate that some computer architectures conflate volatile memory and non-volatile memory.

Various sets of computer-readable and/or processor-readable instructions (also called program modules), application programs and/or data can be stored in system memory 708. For example, system memory 708 may store an operating system 726, server instructions 728, calculations instructions 730, and/or run-time instructions 732. While shown in FIG. 7 as being stored in system memory 708, the program modules and other data can be stored elsewhere including in non-volatile memory 722 or in one or more other non-transitory computer-readable and/or processor-readable media.

Analog computer 704 can be provided in an isolated environment (not shown). For example, where analog computer 704 is a quantum computer, the environment shields the internal elements of the quantum computer from heat, magnetic field, and the like. Analog computer 704 includes one or more analog processors such as quantum processor(s) 734. Analog computer 704 may advantageously include one or more of the circuits illustrated and described in the present systems and methods.

A quantum processor includes programmable elements such as qubits, couplers, and other devices. In at least one implementation, the qubits are superconducting flux qubits. The qubits are read out via readout system 736. These results can be fed to the various sets of computer-readable and/or processor-readable instructions for digital computer 702. Analog computer 704 can include a qubit control system 738 and a coupler control system 740. Coupler control system 740 can provide control of communicative coupling between qubits such as inductive and capacitive communicative coupling described in the present application. In some embodiments, hybrid computer 700 is used to implement quantum annealing on quantum processor 734.

Examples of qubits include superconducting flux qubits, superconducting charge qubits, and the like. In a superconducting flux qubit, the Josephson energy dominates or is equal to the charging energy. In a charge qubit it is the reverse. Examples of flux qubits that may be used include RF-SQUIDs, which include a superconducting loop interrupted by one Josephson junction, persistent current qubits, which include a superconducting loop interrupted by three Josephson junctions, and the like. In some embodiments, the qubits and couplers are controlled by on chip circuitry. Examples of on-chip control circuitry can be found in U.S. Pat. Nos. 7,876,248; 7,843,209; 8,018,244; 8,098,179; 8,169,231; and 8,786,476. Further details and implementations of exemplary quantum processors that may be used in conjunction with the present systems and devices are described in, for example, U.S. Pat. Nos. 7,533,068; 8,008,942; 8,195,596; 8,190,548; and 8,421,053.

Kinetic Inductance for Compact Quantum Flux Parametron (QFP) Stages

Kinetic inductance materials that have a higher kinetic inductance than magnetic inductance can also be used for implementing on-chip memory devices in superconducting processors. On-chip memory devices can store qubit state information after an anneal cycle. An on-chip memory design may be based on a shift register that comprises several quantum flux parametron (QFP) stages, such as the shift register described in U.S. Pat. No. 8,018,244. An on-chip memory device can comprise multiple QFP stages that can be used to store data (e.g., qubit state information). Such on-chip memory devices can be useful in several implementations. For instance, a quantum processor can be annealed and the results can be pushed sequentially into each stage of the on-chip memory a few flux quanta at a time before being sent to a readout system. In another example, an on-chip memory device may be useful for programming a DAC, wherein each stage of the on-chip memory device acts as a loadable portion of the DAC that can store a flux state. Additionally, an on-chip memory device may be useful for setting a group of initial qubit states for reverse annealing. In particular, the on-chip memory can allow for fast reverse annealing on large groups of initial qubit states without requiring reprogramming DACs after each anneal.

In most cases, a typical shift register used for readout in a quantum processor is designed to transfer data along relatively large distances in the quantum processor and thus can occupy a large geometric area. Since on-chip memory devices are not required to transfer data along relatively large distances, it can be desirable to reduce its geometric footprint to allow for scalability of other devices. To reduce the area occupied by on-chip memory devices, a high kinetic inductance material can be implemented. The high kinetic inductance material can allow a large inductance for a relatively small geometric area.

Each stage of an on-chip memory device can comprise a body loop and a compound Josephson Junction (CJJ) loop, which can each exist in different wiring layers of an integrated circuit. A flux bias line is typically used to apply a bias to either the body loop or the compound CJJ loop. However, in some cases, the body loop and the CJJ loop occupy a similar geometric area which can make it difficult to apply a bias to the CJJ loop independently from the body loop. This problem can be addressed by winding the body loop symmetrically with respect to the flux bias line and winding the CJJ loop asymmetrically with respect to the flux bias line. This winding configuration can at least partially cancel out a bias on the body loop when the CJJ loop is biased by the flux bias line.

Figure 8A:
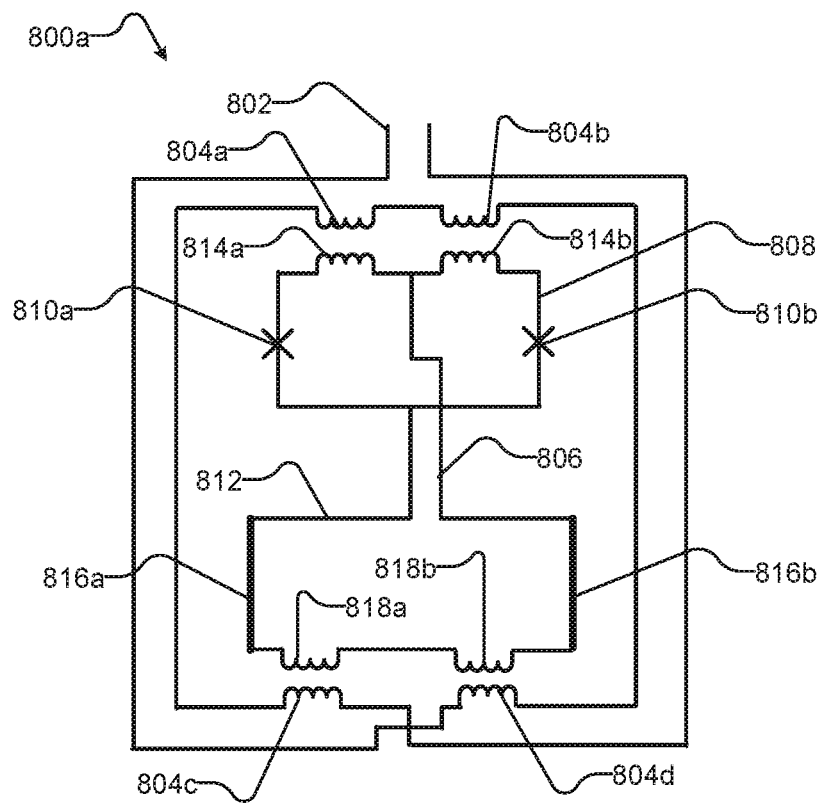
FIG. 8A and FIG. 8B are schematic diagrams illustrating an example superconducting circuit including a QFP stage of an on-chip memory device, in accordance with the present systems, devices, and methods.
Figure 8B:
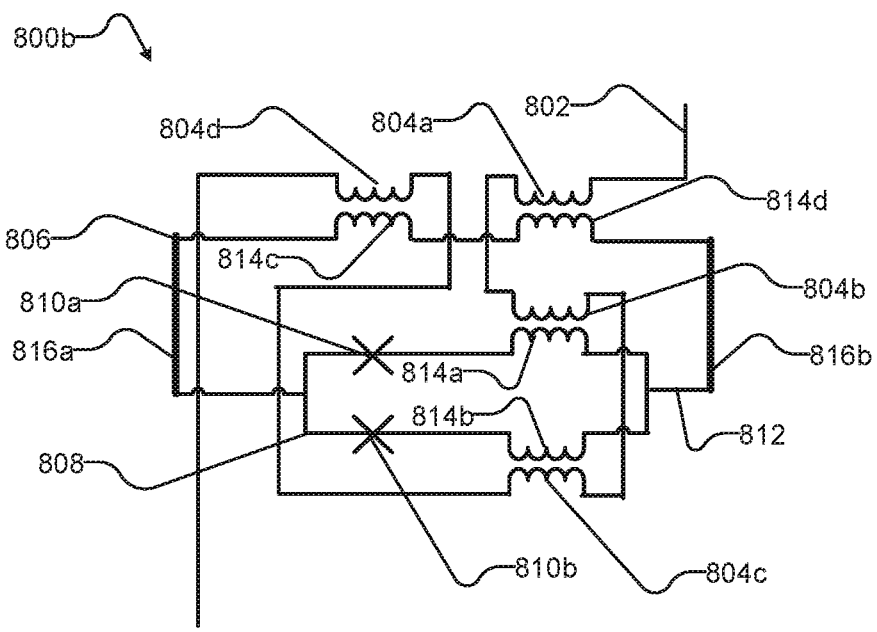

FIG. 8A and FIG. 8B are schematic diagrams illustrating an example superconducting circuit 800a including a QFP stage of a memory device, in accordance with the present systems, devices, and methods. FIG. 8B illustrates the same circuit and same elements as FIG. 8A, but elements 802-816b are rearranged for clarity.

Circuit 800a includes a flux bias line 802 having a set of biasing inductances 804a, 804b, 804c, 804d. Circuit 800a also includes a QFP stage 806 comprising a QFP CJJ loop 808 interposed in a QFP body loop 812. QFP CJJ loop 808 includes a pair of Josephson junctions 810a, 810b and a set of QFP CJJ loop inductances 814a, 814b. QFP CJJ loop 808 is magnetically communicatively coupled to flux bias line 802 by biasing inductances 804a, 804b and QFP CJJ loop inductances 814a, 814b. QFP stage 806 includes at least one segment of kinetic inductance material 816a, 816b (collectively and individually 816) interposed in QFP body loop 812. Segment of kinetic inductance material 816 is illustrated with a bolded line in FIG. 8A and FIG. 8B. Segment of kinetic inductance material 816 can comprise a material exhibiting more kinetic inductance than magnetic inductance. In some implementations, segment of kinetic inductance material 816 can comprise TIN, NbN, NbTIN, WSi, oxidized granular Al, or a combination thereof. QFP body loop 812 can include a set of QFP body loop inductances 818a, 818b that are each magnetically communicatively coupled to biasing inductances 804c, 804d of flux bias line 802. QFP CJJ loop 808 and QFP body loop 812 can each comprise a material that is superconducting in a respective range of temperatures (e.g., niobium or aluminum).

In some implementations, in an integrated circuit including multiple layers, at least a portion of QFP CJJ loop 808 can exist in a first wiring layer and at least a portion of QFP body loop 812 can exist in a second wiring layer overlying the first wiring layer. Flux bias line 802 can exist in a third wiring layer. QFP body loop 812 can occupy at least the same geometric area as QFP CJJ loop 808, or QFP body loop 812 can occupy a larger geometric area than QFP CJJ loop 808 (i.e., the QFP CJJ loop geometric area can be smaller than the QFP body loop geometric area). QFP body loop 812 can be wound asymmetrically relative to flux bias line 802 and QFP CJJ loop 808 can be wound symmetrically relative to flux bias line 802 (not illustrated). This can offset indirect biasing of, for example, biasing inductances 804c, 804d of flux bias line 802 on QFP CJJ loop inductances 814a, 814b of QFP CJJ loop 808.

Circuit 800a of FIG. 8A and FIG. 8B illustrate a non-winding QFP CJJ loop 808, a non-winding QFP body loop 812, and a winding flux bias line 802 for clarity in the drawing. A non-winding flux bias line 802 having the same coupling arrangement includes an asymmetrically wound QFP body loop 812 and a symmetrically wound QFP CJJ loop 808.

Figure 9:
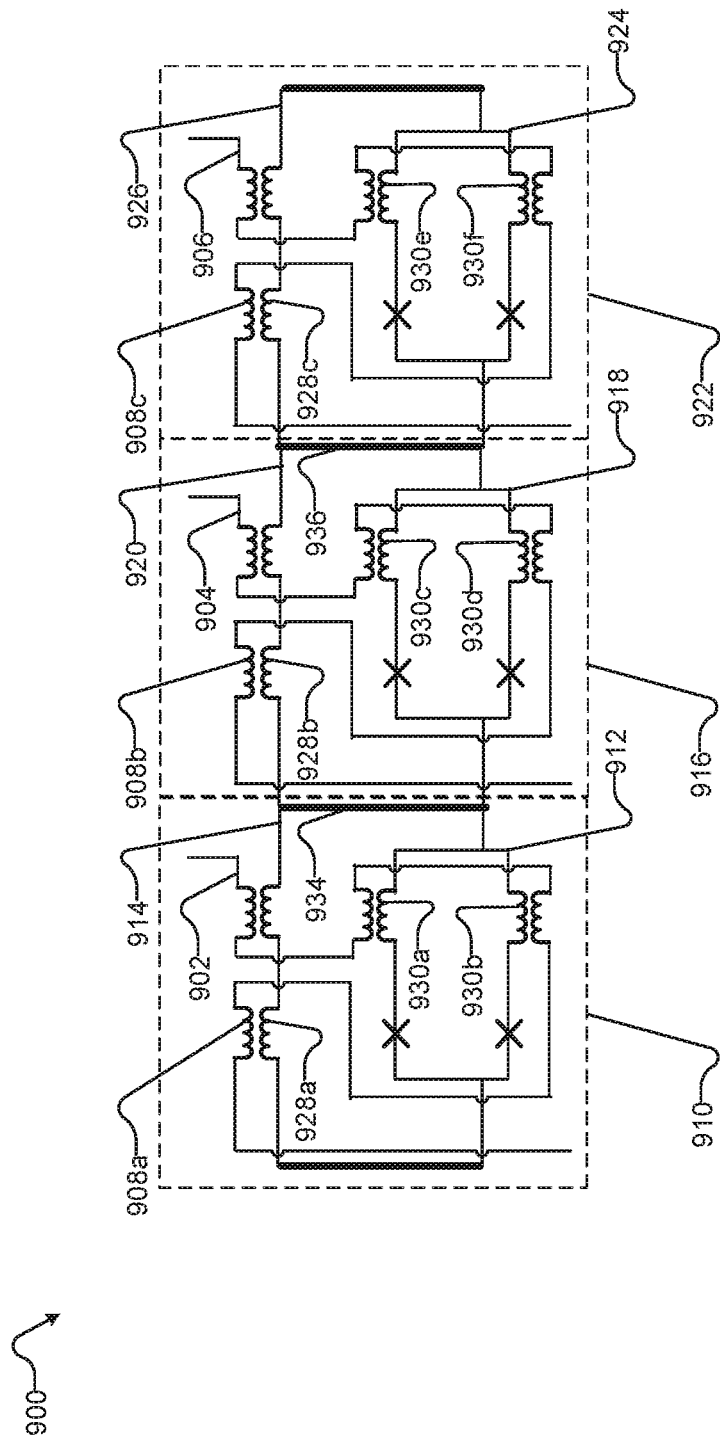
FIG. 9 is a schematic diagram illustrating an example superconducting circuit including an on-chip memory device comprising three QFP stages, in accordance with the present systems, devices, and methods.

FIG. 9 is a schematic diagram illustrating an example superconducting circuit 900 including a memory device comprising three QFP stages, in accordance with the present systems, devices, and methods.

Circuit 900 includes a first flux bias line 902, a second flux bias line 904, and a third flux bias line 906, which each comprise a set of biasing inductances 908a, 908b, 908c (collectively and individually 908, and only three labeled to avoid drawing clutter). Circuit 900 also includes a first QFP stage 910 comprising a first QFP CJJ loop 912 interposed in a first QFP body loop 916. First QFP CJJ loop 912 includes a pair of Josephson junctions and a set of QFP CJJ loop inductances 930a, 930b (collectively 930). First QFP CJJ loop 912 is magnetically communicatively coupled to first flux bias line 902 by biasing inductances 908 and QFP CJJ loop inductances 930a (only three labelled to avoid drawing clutter). First QFP stage 910 includes a first segment of kinetic inductance material 934 interposed in first QFP body loop 914. First segment of kinetic inductance material 934 galvanically couples first QFP stage 910 to a second QFP stage 916. First QFP body loop 914 can include a set of QFP body loop inductances 928a (only three labelled to avoid drawing clutter) that are each magnetically communicatively coupled to biasing inductances 908 of first flux bias line 902. First QFP CJJ loop 912 and first QFP body loop 914 can each comprise a material that is superconductive in a respective range of temperatures (e.g., niobium or aluminum).

Circuit 900 includes second QFP stage 916 comprising a second QFP CJJ loop 918 interposed in a second QFP body loop 920. Second QFP CJJ loop 918 includes a pair of Josephson junctions and QFP CJJ loop inductances 930. Second QFP CJJ loop 918 is magnetically communicatively coupled to second flux bias line 904 by biasing inductances 908 and QFP CJJ loop inductances 930*c*, 930*d*. Second QFP stage 916 includes first segment of kinetic inductance material 934 interposed in first QFP body loop 914. First segment of kinetic inductance material 934 galvanically couples first QFP stage 910 to second QFP stage 916. Second QFP stage 916 also includes a second segment of kinetic inductance material 936 interposed in second QFP body loop 920. Second segment of kinetic inductance material 936 galvanically couples second QFP stage 916 to a third QFP stage 922. Second QFP body loop 920 can include QFP body loop inductances 928*b* (only one labelled to avoid drawing clutter) that are each magnetically communicatively coupled to biasing inductances 908 of second flux bias line 904. Second QFP CJJ loop 918 and second QFP body loop 920 can each comprise a material that is superconductive in a respective range of temperatures (e.g., niobium or aluminum).

Circuit 900 includes third QFP stage 922 comprising a third QFP CJJ loop 924 interposed in a third QFP body loop 926. Third QFP CJJ loop 924 includes a pair of Josephson junctions and QFP CJJ loop inductances 930. Third QFP CJJ loop 924 is magnetically communicatively coupled to third flux bias line 906 by biasing inductances 908 and QFP CJJ loop inductances 930*e*, 930*f*. Third QFP stage 922 includes second segment of kinetic inductance material 936 interposed in second QFP body loop 920. Second segment of kinetic inductance material 936 galvanically couples second QFP stage 916 to third QFP stage 922. Third QFP body loop 926 can include QFP body loop inductances 928*c* (only one labelled to avoid drawing clutter) that are each magnetically communicatively coupled to biasing inductances 908 of third flux bias line 906. Third QFP CJJ loop 924 and third QFP body loop 926 can each comprise a material that is superconductive in a respective range of temperatures (e.g., niobium or aluminum).

First segment of kinetic inductance material 934 and second segment of kinetic inductance material 936 are each illustrated with a bolded line in FIG. 9. First segment of kinetic inductance material 934 and second segment of kinetic inductance material 936 exhibit more kinetic inductance than magnetic inductance, respectively. In some implementations, first segment of kinetic inductance material 934 and second segment of kinetic inductance material 936 comprise TIN, NbN, NbTIN, WSi, oxidized granular Al, or a combination thereof.

In some implementations, in an integrated circuit including multiple layers, at least a portion of each of: first QFP body loop 914, second QFP body loop 920, and third QFP body loop 926 exist in a first wiring layer and at least a portion of each of: first QFP CJJ loop 912, second QFP CJJ loop 918, and third QFP CJJ loop 924 exist in a second wiring layer underlying the first wiring layer. In some cases, first QFP body loop 914 can occupy at least the same geometric area as first QFP CJJ loop 912, or first QFP body loop 914 can occupy a larger geometric area than first QFP CJJ loop 912 (i.e., the QFP CJJ loop geometric area can be smaller than the QFP body loop geometric area). The aforementioned can apply to the equivalent elements of second QFP stage 916 and third QFP stage 922, respectively. In such cases, the geometric layout can make it difficult to apply a bias to a QFP body loop independently from a QFP CJJ loop, and vice versa. This problem can be addressed by winding the body loop and CJJ loop of each QFP stage in a certain arrangement relative to a respective flux bias line to offset indirect biasing. First QFP body loop 914 can be wound asymmetrically relative to first flux bias line 902 and first QFP CJJ loop 912 can be wound symmetrically relative to first flux bias line 902 (not illustrated). This can offset indirect biasing of, for example, biasing inductance 908*a* of first flux bias line 902 on QFP CJJ loop inductance 930*a* of first QFP CJJ loop 912.

Circuit 900 includes first QFP stage 910, second QFP stage 916, and third QFP stage 922 to comprise a memory administration system (e.g., a memory register) that is operable to store a single bit of data. For example, a result of an anneal (i.e., a qubit state), can be received from a shift register by first QFP stage 910, then sequentially shifted to second QFP stage 916 and third QFP stage 922. Additional results of the anneal can be sent from the shift register to the memory administration system embodied by circuit 900 until first QFP stage 910, second QFP stage 916, and third QFP stage 922 are collectively filled with a single bit of data. Results can be sent from circuit 900 to a readout system by shifting each state consecutively to each QFP stage. For example, a state stored in third QFP stage 922 can be shifted to a readout system, and concurrently, another state stored in second QFP stage 916 can be shifted to third QFP stage 922, and yet another state stored in first QFP stage 910 can be shifted to second QFP stage 916. This shifting and reading sequence can continue until all states have been shifted to the readout system.

Figure 10:
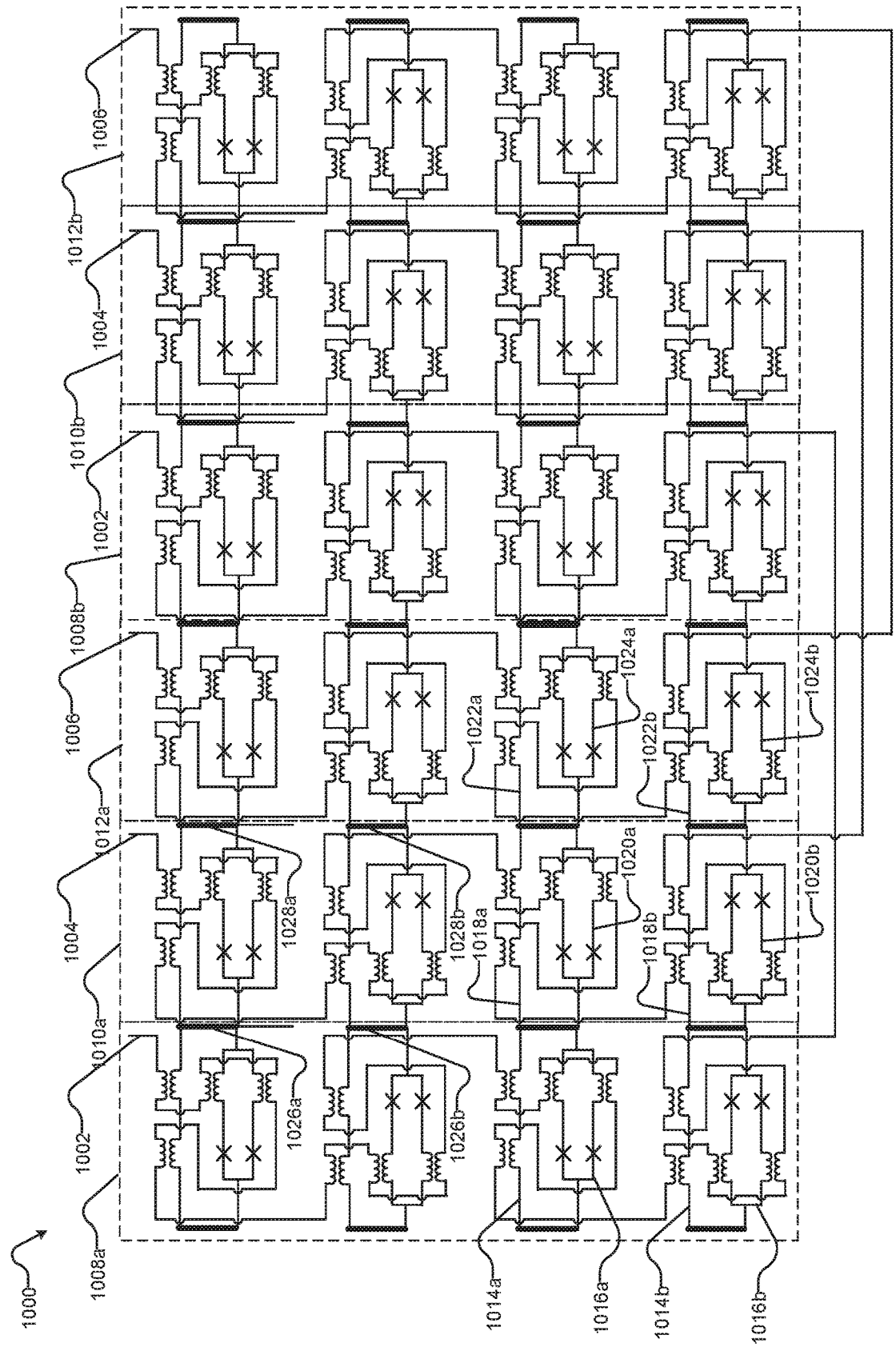
FIG. 10 is a schematic diagram illustrating an example superconducting circuit including an on-chip memory administration system comprising multiple columns of QFP stages, in accordance with the present systems, devices, and methods.

FIG. 10 is a schematic diagram illustrating an example superconducting circuit 1000 including a memory administration system comprising multiple columns of QFP stages, in accordance with the present systems, devices, and methods.

Circuit 1000 includes a first flux bas line 1002, a second flux bias line 1004, and a third flux bias line 1006, which each comprise a set of biasing inductances.

Circuit 1000 includes two columns of first QFP stages 1008*a*, 1008*b* (collectively and individually 1008). Each first QFP stage of each column includes a respective first QFP CJJ loop 1016*a*, 1016*b* (collectively and individually 1016, only two labeled to avoid drawing clutter) interposed in a respective first QFP body loop 1014*a*, 1014*b* (collectively and individually 1014, only two labeled to avoid drawing clutter). Each first QFP body loop 1014 includes a number of QFP body loop inductances and a respective first shared segment of kinetic inductance material 1026*a*, 1026*b* (collectively 1026, only two labelled to avoid drawing clutter). First shared segments of kinetic inductance material can comprise TIN, NbN, NbTIN, WSi, oxidized granular Al, or a combination thereof. Each first QFP CJJ loop 1016 includes a number of QFP CJJ loop inductances and a respective pair of Josephson junctions. First QFP stages of each column of first QFP stages 1008 can comprise at least one of aluminum and niobium.

First flux bias line 1002 is magnetically communicatively coupled to each first QFP body loop 1014 of the two columns of first QFP stages 1008 by a respective biasing inductance and a respective QFP body loop inductance. First flux bias line 1002 is magnetically communicatively coupled to each first QFP CJJ loop 1016 of the two columns of first QFP stages 1008 by a respective biasing inductance and a respective QFP CJJ loop inductance.

In some implementations, in an integrated circuit comprising multiple layers, at least a portion of each first QFP body loop 1014 of each column of first QFP stages 1008 can be in a first wiring layer, and at least a portion of each first QFP CJJ loop 1016 of each column of first QFP stages 1008 can be in a second wiring layer underlying the first wiring layer. In some cases, each first QFP body loop 1014 can occupy at least the same geometric area as a respective first QFP CJJ loop 1016, or each first QFP body loop 1014 can occupy a greater geometric area than a respective first QFP CJJ loop 1016. First QFP body loops 1014 are each wound asymmetrically relative to first flux bias line 1002. First QFP CJJ loops 1016 are each wound symmetrically relative to first flux bias line 1002. This winding configuration can allow first flux bias line 1002 to bias first QFP CJJ loop 1016 while reducing a resulting indirect bias applied to first QFP body loop 1014 by at least partially cancelling out the indirect bias applied to first QFP body loop 1014.

Circuit 1000 includes two columns of second QFP stages 1010a, 1010b (collectively and individually 1010). Each one of each column of second QFP stages includes a respective second QFP CJJ loop 1020a, 1020b (collectively and individually 1020, only two labeled to avoid drawing clutter) interposed in a respective second QFP body loop 1018a, 1018b (collectively and individually 1018, only two labeled to avoid drawing clutter). Each second QFP body loop 1018 includes a number of QFP body loop inductances and a respective second shared segment of kinetic inductance material 1028a, 1028b (collectively 1028, only two labelled to avoid drawing clutter). Second shared segments of kinetic inductance material can comprise TiN, NbN, NbTIN, WSi, oxidized granular Al, or a combination thereof. Each second QFP body loop 1018 also includes a respective first shared segment of kinetic inductance material 1026 interposed in a respective first QFP body loop 1014. Each first shared segment of kinetic inductance material 1026 galvanically couples a respective first QFP body loop 1014 to a respective second QFP body loop 1018. Each second QFP CJJ loop 1020 includes a number of QFP CJJ loop inductances and a respective pair of Josephson junctions. Second QFP stages of each column of second QFP stages 1008 can comprise at least one of aluminum and niobium.

Second flux bias line 1004 is magnetically communicatively coupled to each second QFP body loop 1018 of the two columns of second QFP stages 1008 by a respective biasing inductance and a respective QFP body loop inductance. Second flux bias line 1004 is magnetically communicatively coupled to each second QFP CJJ loop 1020 of the two columns of second QFP stages 1008 by a respective biasing inductance and a respective QFP CJJ loop inductance.

In some implementations, in an integrated circuit comprising multiple layers, at least a portion of each second QFP body loop 1018 of each column of second QFP stages 1008 can be in a second wiring layer, and at least a portion of each second QFP CJJ loop 1020 of each column of second QFP stages 1008 can be in a second wiring layer underlying the second wiring layer. In some cases, each second QFP body loop 1018 can occupy at least the same geometric area as a respective second QFP CJJ loop 1020, or each second QFP body loop 1018 can occupy a greater geometric area than a respective second QFP CJJ loop 1020. Second QFP body loops 1018 are each wound asymmetrically relative to second flux bias line 1004. Second QFP CJJ loops 1020 are each wound symmetrically relative to second flux bias line 1004. This configuration can at least partially offset indirect biasing of second flux bias line on second QFP CJJ loop from second QFP body loop, for example.

Circuit 1000 includes two columns of third QFP stages 1012a, 1012b (collectively and individually 1012). Each one of each column of third QFP stages includes a respective third QFP CJJ loop 1024a, 1024b (collectively and individually 1024, only two labeled to avoid drawing clutter) interposed in a respective third QFP body loop 1022a, 1022b (collectively and individually 1022, only two labeled to avoid drawing clutter). Each third QFP body loop 1022 includes a number of QFP body loop inductances and a respective additional shared segment of kinetic inductance material 1030a, 1030b (collectively 1030, only two labelled to avoid drawing clutter). Each additional shared segment of kinetic inductance material 1030 galvanically couples a respective third QFP body loop 1022 to a respective first QFP body loop 1014. Third shared segments of kinetic inductance material can comprise TiN, NbN, NbTIN, WSi, oxidized granular Al, or a combination thereof. Each third QFP body loop 1022 also includes a respective second shared segment of kinetic inductance material 1026 interposed in a respective second QFP body loop 1014. Each second shared segment of kinetic inductance material 1026 galvanically couples a respective second QFP body loop 1014 to a respective third QFP body loop 1022. Each third QFP CJJ loop 1024 includes a number of QFP CJJ loop inductances and a respective pair of Josephson junctions. Third QFP stages of each column of third QFP stages 1008 can comprise at least one of aluminum and niobium.

Third flux bias line 1006 is magnetically communicatively coupled to each third QFP body loop 1022 of the two columns of third QFP stages 1008 by a respective biasing inductance and a respective QFP body loop inductance. Third flux bias line 1006 is magnetically communicatively coupled to each third QFP CJJ loop 1024 of the two columns of third QFP stages 1008 by a respective biasing inductance and a respective QFP CJJ loop inductance.

In some implementations, in an integrated circuit comprising multiple layers, at least a portion of each third QFP body loop 1022 of each column of third QFP stages 1008 can be in a third wiring layer, and at least a portion of each third QFP CJJ loop 1024 of each column of third QFP stages 1008 can be in a third wiring layer underlying the third wiring layer. In some cases, each third QFP body loop 1022 can occupy at least the same geometric area as a respective third QFP CJJ loop 1024, or each third QFP body loop 1022 can occupy a greater geometric area than a respective third QFP CJJ loop 1024. Third QFP body loops 1022 are each wound asymmetrically relative to third flux bias line 1006. Third QFP CJJ loops 1024 are each wound symmetrically relative to third flux bias line 1006. This configuration can at least partially offset indirect biasing of third flux bias line on third QFP CJJ loop from third QFP body loop, for example.

Columns of first QFP stages 1008, columns of second QFP stages 1010, and columns of third QFP stages 1012 of circuit 1000 comprise a memory administration system (e.g., a memory block, memory register) that is operable to store 8 bits of data. Circuit 1000 can be coupled to a shift register (not illustrated) at one end and a readout system (not illustrated) at another end. For example, a result of an anneal (e.g., a qubit state) can be received from a shift register by a first QFP stage of column of first QFP stages 1008a, shifted through various QFP stages of circuit 100 comprising the memory administration system, and sent to a readout system by a third QFP stage of column of third QFP stages 1012b. Additional results of the anneal can be sent from the shift register to circuit 1000 until columns of first QFP stages 1008, columns of second QFP stages 1010, and columns of third QFP stages 1012 are collectively filled with at least 8 bits of data. Results can be sent from circuit 1000 to a readout system by shifting each state consecutively to each QFP stage. For example, a state may be shifted from circuit 1000 to a readout system in the following sequence: a first QFP stage of column of first QFP stages 1008*a*, a second QFP stage of column of second QFP stages 1010*a*, a third QFP stage of column of third QFP stages 102*a*, another first QFP stage of first QFP stages 1008*b*, another second QFP stage of second QFP stages 1010*b*, another third QFP stage of third QFP stages 1012*b*, and then the readout system.

Certain aspects of the present systems and devices may be realized at room temperature, and certain aspects may be realized at a superconducting temperature. Thus, throughout this specification and the appended claims, the term "superconducting" or "superconductive" when used to describe a physical structure such as a "superconducting wire" or "superconductive material" is used to indicate a material that can behave as a superconductor at below a respective critical temperature. A superconducting material may not necessarily be acting as a superconductor at all times in all implementations of the present systems and devices. It is also noted that the teachings provided herein may be applied in non-superconducting applications.

The above described method(s), process(es), or technique(s) could be implemented by a series of processor readable instructions stored on one or more nontransitory processor-readable media. Some examples of the above described method(s), process(es), or technique(s) method are performed in part by a specialized device such as an adiabatic quantum computer or a quantum annealer or a system to program or otherwise control operation of an adiabatic quantum computer or a quantum annealer, for instance a computer that includes at least one digital processor. The above described method(s), process(es), or technique(s) may include various acts, though those of skill in the art will appreciate that in alternative examples certain acts may be omitted and/or additional acts may be added. Those of skill in the art will appreciate that the illustrated order of the acts is shown for exemplary purposes only and may change in alternative examples. Some of the exemplary acts or operations of the above described method(s), process(es), or technique(s) are performed iteratively. Some acts of the above described method(s), process(es), or technique(s) can be performed during each iteration, after a plurality of iterations, or at the end of all the iterations.

The above description of illustrated implementations, including what is described in the Abstract, is not intended to be exhaustive or to limit the implementations to the precise forms disclosed. Although specific implementations of and examples are described herein for illustrative purposes, various equivalent modifications can be made without departing from the spirit and scope of the disclosure, as will be recognized by those skilled in the relevant art. The teachings provided herein of the various implementations can be applied to other methods of quantum computation, not necessarily the exemplary methods for quantum computation generally described above.

The various implementations described above can be combined to provide further implementations. All of the commonly assigned US patent application publications, US patent applications, foreign patents, and foreign patent applications referred to in this specification and/or listed in the Application Data Sheet are incorporated herein by reference, in their entirety, including but not limited to:

U.S. Pat. Nos. 7,135,70; 7,418,283; 9,978,809; 7,876,248; 7,843,209; 8,018,244; 8,098,179; 8,169,231; 8,786,476; 7,533,068; 8,008,942; 8,195,596; 8,190,548; 8,018,244; and 8,421,053, and US Patent Application Nos. 62/693,305; 62/806,240; and 62/863,431

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A superconducting integrated circuit comprising:
   a first flux bias line including a first number of biasing inductances, a second flux bias line including a second number of biasing inductances, and a third flux bias line including a third number of biasing inductances; and
   a first quantum flux parametron (QFP) stage, a second QFP stage, and a third QFP stage, each of the first, second, and third QFP stages associated respectively with the first flux bias line, the second flux bias line, and the third flux bias line and including, respectively:
      a QFP body loop including a number of QFP body loop inductances, the QFP body loop wound asymmetrically relative to the respective flux bias line;
      a QFP compound Josephson junction (CJJ) loop interrupted by a pair of Josephson junctions and a number of QFP CJJ loop inductances, the QFP CJJ loop interposed in the QFP body loop, the QFP CJJ loop wound symmetrically relative to the respective flux bias line; and
      a shared segment of kinetic inductance material interposed in the QFP body loop, wherein:
         the respective flux bias line is magnetically communicatively coupled to the QFP body loop by one of the number of the QFP body loop inductances and one of the respective number of biasing inductances; and
         the respective flux bias line is magnetically communicatively coupled to the QFP CJJ loop by one of the number of QFP CJJ inductances and one of the respective number of biasing inductances and
      wherein each QFP body loop is included in a first wiring layer and each QFP CJJ loop are included in a second wiring layer underlying the first wiring layer.

2. The superconducting integrated circuit of claim 1 wherein:
   each QFP body loop occupies a respective body loop geometric area and each QFP CJJ loop occupies a respective CJJ loop geometric area that is at least as small as the respective body loop geometric area.

3. The superconducting integrated circuit of claim 1 wherein each shared segment of kinetic inductance material comprises at least one of: TIN, NbN, NbTiN, and WSi.

4. The superconducting integrated circuit of claim 1 wherein each QFP body loop and each QFP CJJ loop respectively comprise at least one of: niobium and aluminum.

5. A superconducting integrated circuit comprising:
   a first quantum flux parametron (QFP) stage comprising a first QFP body loop and a first QFP CJJ loop;
   a second QFP stage comprising a second QFP body loop and a second QFP CJJ loop;
   a first shared segment of kinetic inductance material interposed in the first QFP body loop and the second QFP body loop, the first shared segment of kinetic inductance material galvanically coupling the first QFP stage to the second QFP stage;

a first flux bias line magnetically communicatively coupled to the first QFP stage, the first QFP body loop wound asymmetrically relative to the first flux bias line, the first QFP CJJ loop wound symmetrically relative to the first flux bias line;

a second flux bias line magnetically communicatively coupled to the second QFP stage, the second QFP body loop wound asymmetrically relative to the second flux bias line, the second QFP CJJ loop wound symmetrically relative to the second flux bias line;

a third QFP stage comprising a third QFP body loop and a third QFP CJJ loop;

a second shared segment of kinetic inductance material interposed in the third QFP body loop and the second QFP body loop, the second shared segment of kinetic inductance material galvanically coupling the second QFP stage to the third QFP stage;

a third flux bias line magnetically communicatively coupled to the third QFP stage, the third QFP body loop wound asymmetrically relative to the third flux bias line, the third QFP CJJ loop wound symmetrically relative to the third flux bias line; and the first QFP stage, the second QFP stage, the third QFP stage, the first flux bias line, the second flux bias line, and the third flux bias line each comprise at least one material that is superconductive in a range of temperatures below a respective critical temperature; and the first QFP body loop, the second QFP body loop, and the third QFP body loop are included in a first wiring layer, and the first QFP CJJ loop, the second QFP CJJ loop, and the third QFP CJJ loop are included in a second wiring layer underlying the first wiring layer.

6. The superconducting integrated circuit of claim 5 wherein the first and second shared segments of kinetic inductance material comprises at least one of: TiN, NbN, NbTiN, and WSi.

7. The superconducting integrated circuit of claim 5 wherein the first QFP stage, the second QFP stage, and the third QFP stage each comprise at least one of: niobium and aluminum.

8. A memory administration system for a quantum processor, the memory administration system comprising:

a column of first QFP stages, each first QFP stage of the column of first QFP stages including a respective first QFP body loop, a respective first QFP CJJ loop, and a respective first shared segment of kinetic inductance material interposed in the respective first QFP body loop;

a first flux bias line serially communicatively coupling each of the first QFP stages in the column of first QFP stages, wherein the respective first QFP body loop of each first QFP stage winds asymmetrically relative to the first flux bias line and the respective first QFP CJJ loop of each first QFP stage winds symmetrically relative to the first flux bias line;

a column of second QFP stages, each second QFP stage of the column of second QFP stages including a respective second QFP body loop and a respective second QFP CJJ loop, the respective second QFP body loop including the respective first shared segment of kinetic inductance material interposed in the respective first QFP body loop of each first QFP stage of the column of first QFP stages; and a second flux bias line serially communicatively coupling each of the second QFP stages in the column of second QFP stages, wherein the respective second QFP body loop of each second QFP stage winds asymmetrically relative to the second flux bias line and the respective second QFP CJJ loop of each second QFP stage winds symmetrically relative to the second flux bias line, wherein:

each first QFP stage of the column of first QFP stages is galvanically coupled to a respective second QFP stage of the column of second QFP stages by the respective first shared segment of kinetic inductance material interposed in the respective first QFP body loop of each first QFP stage of the column of first QFP stages.

9. The memory administration system of claim 8 wherein:

the respective first QFP body loop of each first QFP stage of the column of first QFP stages and the respective second QFP body loop of each second QFP stage of the column of second QFP stages are each included in a first wiring layer of an integrated circuit; and the respective first QFP CJJ loop of each first QFP stage of the column of first QFP stages and the respective second QFP CJJ loop of each second QFP stage of the column of second QFP stages are each included in a second wiring layer underlying the first wiring layer of an integrated circuit.

10. The memory administration system of claim 8 further comprising:

a column of third QFP stages, each third QFP stage of the column of third QFP stages including a respective third QFP body loop, a respective third QFP CJJ loop, and a respective second shared segment of kinetic inductance material interposed in the respective third QFP body loop of each third QFP stage of the column of third QFP stages;

a third flux bias line serially communicatively coupling the third QFP stages in the column of third QFP stages, wherein the respective third QFP body loop of each third QFP stage winds asymmetrically relative to the third flux bias line and the respective third QFP CJJ loop of each third QFP stage winds symmetrically relative to the third flux bias line, wherein;

the respective second QFP body loop of each second QFP stage of the column of second QFP stage includes the respective second shared segment of kinetic inductance material interposed in the respective third QFP body loop of each third QFP stage of column of third QFP stages; and each third QFP stage of the column of third QFP stages is galvanically coupled to a respective second QFP stage of the column of second QFP stages by the respective second shared segment of kinetic inductance material interposed in the respective third QFP body loop of each third QFP stage of the column of third QFP stages.

11. The memory administration system of claim 10 wherein each of the respective first shared segment of kinetic inductance material and the respective second shared segment of kinetic inductance material comprises at least one of: TIN, NbN, NbTiN, and WSi.

12. The memory administration system of claim 10 wherein:

the respective first QFP body loop of each first QFP stage of the column of first QFP stages, the respective second QFP body loop of each second QFP stage of the column of second QFP stages, and the respective third QFP body loop of each third QFP stage of the column of third QFP stages are each included in a first wiring layer of an integrated circuit; and the respective first QFP CJJ loop of each first QFP stage of the column of first QFP stages, the respective second QFP body loop of each second QFP stage of the column of second QFP stages, and the respective third QFP body loop of each third QFP stage of the column of third QFP stages are each included in a second wiring layer underlying the first wiring layer of the integrated circuit.

13. The memory administration system of claim 10 wherein each first QFP stage of the column of first QFP stages, each second QFP stage of the column of second QFP stages, and each third QFP stage of the column of third QFP stages comprise at least one of: niobium and aluminum.

14. The memory administration system of claim 10 wherein
- one first QFP stage of the column of first QFP stages, one second QFP stage of the column of second QFP stages, and one third QFP stage of the column of third QFP stages form a first row;
- another first QFP stage of the column of first QFP stages, another second QFP stage of the column of second QFP stages, and another third QFP stage of the third QFP stages form a second row;
- the first row is communicatively coupled to the second row by the first flux bias line, the second flux bias line, and the third flux bias line; and
- the first row and the second row comprise a memory block operable to store a qubit state.

15. The memory administration system of claim 10 further comprising an additional column of first QFP stages, an additional column of second QFP stages, and an additional column of third QFP stages, wherein:
- the additional column of first QFP stages is coupled to the column of third QFP stages by a respective additional shared segment of kinetic inductance material interposed in a respective first QFP body loop of each first QFP stage of the additional column of first QFP stages;
- the first flux bias line serially communicatively couples the first QFP stages of the column of first QFP stages to the first QFP stages of the additional column of first QFP stages;
- the second flux bias line serially communicatively couples the second QFP stages of the column of second QFP stages to the second QFP stages of the additional column of second QFP stages; and
- the third flux bias line serially communicatively couples the third QFP stages of the column of third QFP stages to the third QFP stages of the additional column of third QFP stages.

* * * * *